United States Patent
Kagawa

(10) Patent No.: US 9,550,206 B2
(45) Date of Patent: Jan. 24, 2017

(54) ELECTROMAGNETIC-WAVE-ABSORBING FILM AND ITS PRODUCTION METHOD

(71) Applicant: Seiji Kagawa, Koshigaya (JP)

(72) Inventor: Seiji Kagawa, Koshigaya (JP)

( * ) Notice: Subject to any disclaimer, the term of this patent is extended or adjusted under 35 U.S.C. 154(b) by 2 days.

(21) Appl. No.: 14/439,115

(22) PCT Filed: Nov. 5, 2013

(86) PCT No.: PCT/JP2013/079863
§ 371 (c)(1),
(2) Date: Apr. 28, 2015

(87) PCT Pub. No.: WO2014/080754
PCT Pub. Date: May 30, 2014

(65) Prior Publication Data
US 2015/0259546 A1   Sep. 17, 2015

(30) Foreign Application Priority Data
Nov. 20, 2012 (JP) .................................. 2012-254779

(51) Int. Cl.
*B05D 3/00* (2006.01)
*H05K 9/00* (2006.01)
(Continued)

(52) U.S. Cl.
CPC ................. *B05D 3/007* (2013.01); *C09D 5/32* (2013.01); *C09D 7/001* (2013.01); *C09D 7/1216* (2013.01);
(Continued)

(58) Field of Classification Search
None
See application file for complete search history.

(56) References Cited

U.S. PATENT DOCUMENTS
2013/0120959 A1   5/2013   Wano et al.

FOREIGN PATENT DOCUMENTS
JP   2006-114877 A   4/2006
JP   2010-153542 A   7/2010
(Continued)

OTHER PUBLICATIONS
International Search Report, issued in PCT/JP2013/079863, dated Dec. 10, 2013.
(Continued)

*Primary Examiner* — Michael P Rodriguez
(74) *Attorney, Agent, or Firm* — Birch, Stewart, Kolasch & Birch, LLP

(57) ABSTRACT
An electromagnetic-wave-absorbing film comprising an electromagnetic-wave-absorbing layer comprising fine graphene particles and a binder resin, the electromagnetic-wave-absorbing layer being formed by repeating plural times a cycle of applying a dispersion comprising 1-10% by mass of flaky fine graphene particles and 0.05-5% by mass of a binder resin in an organic solvent to a plastic film, and then drying the dispersion; the electromagnetic-wave-absorbing layer having a thickness of 2-15 g/m² (expressed by the weight of fine graphene particles per 1 m²); a mass ratio of the binder resin to fine graphene particles in the electromagnetic-wave-absorbing layer being 0.05-1; and the total area ratio of the fine-graphene-particles-free regions in the electromagnetic-wave-absorbing layer being 5% or less.

5 Claims, 16 Drawing Sheets

(51) Int. Cl.
    *H04B 1/3827*     (2015.01)
    *H04B 1/525*     (2015.01)
    *C09D 5/32*     (2006.01)
    *C09D 7/00*     (2006.01)
    *C09D 7/12*     (2006.01)
    *C09D 133/12*     (2006.01)

(52) U.S. Cl.
    CPC ........... *C09D 7/1283* (2013.01); *C09D 133/12* (2013.01); *H04B 1/3838* (2013.01); *H04B 1/525* (2013.01); *H05K 9/009* (2013.01); *C01B 2204/04* (2013.01); *C01B 2204/32* (2013.01)

(56) References Cited

FOREIGN PATENT DOCUMENTS

| | | | |
|---|---|---|---|
| JP | 2011-249614 A | | 12/2011 |
| JP | 2012-151242 A | | 8/2012 |
| JP | 2012-174833 A | | 9/2012 |
| KR | 20130104869 A | * | 9/2013 |

OTHER PUBLICATIONS

Written Opinion of the International Searching Authority, issued in PCT/JP2013/079863, dated Dec. 10, 2013.

\* cited by examiner

Comparative Example 1

ELECTROMAGNETIC-WAVE-ABSORBING FILM AND ITS PRODUCTION METHOD

FIELD OF THE INVENTION

The present invention relates to an electromagnetic-wave-absorbing film capable of efficiently absorbing near-field electromagnetic waves of several hundreds of MHz to several GHz in mobile information terminals such as cell phones and smartphones, and electronic appliances such as personal computers, etc., and its production method.

BACKGROUND OF THE INVENTION

Recently, mobile communications terminals, electronic appliances, etc. having various functions and high performance have been getting required to be smaller and lighter, so that electronic parts are disposed in a narrower space at higher density, with their speeds increasing. Accordingly, among circuits and parts, electromagnetic wave noises, particularly high-frequency noises of several hundreds of MHz to several GHz have become serious problems. To suppress such near-field electromagnetic wave noises, various electromagnetic-wave-absorbing films have been proposed and put into practical use.

Such electromagnetic-wave-absorbing films mostly contain magnetic materials and/or conductive materials. For example, JP 2010-153542 A discloses an electromagnetic-wave-absorbing film comprising a substrate; a conductive layer formed by a conductive coating material containing particles, flakes or thin wires of metals such as Cu, etc. or carbon; and a magnetic layer formed by a magnetic coating material containing soft-magnetic materials such as ferrite, Sendust, permalloy, etc. However, the electromagnetic-wave-absorbing film disclosed in JP 2010-153542 A is expensive because of having the conductive layer and the magnetic layer, and does not have sufficient absorbability to electromagnetic wave noises of several hundreds of MHz to several GHz.

JP 2006-114877 A discloses an electromagnetic-wave-absorbing sheet obtained by applying an electromagnetic-wave-absorbing coating composition to at least one surface of a substrate sheet made of silicone resins, acrylic resins, polyimide resins, phenol resins, urethane resins, PET, etc.; the electromagnetic-wave-absorbing coating composition comprising (a) 100 parts by weight of a carbon nanomaterial such as carbon nanotube, carbon nanohom, graphite nanofibers, carbon nanofibers, etc., (b) 50-1000 parts by weight of a resin component such as thermoplastic resins such as ABS resins, polyvinylidene fluoride, polyamides, polyimides, polyethylene terephthalate, polycarbonates, polyvinyl chloride, etc., thermosetting resins such as epoxy resins, phenol resins, etc., or UV-curing resins such as polyesters, polyvinyl butyral, acrylics, phenols, polyurethanes, etc., and (c) 50-3000 parts by weight of an organic solvent such as ketones, saturated hydrocarbons, aromatic hydrocarbons, glycol ethers, glycol etheresters, alcohols, etc. However, the electromagnetic-wave-absorbing sheet disclosed in JP 2006-114877 A does not have sufficient absorbability to electromagnetic wave noises of several hundreds of MHz to several GHz.

OBJECT OF THE INVENTION

Accordingly, an object of the present invention is to provide an electromagnetic-wave-absorbing film having high absorbability to electromagnetic wave noises of several hundreds of MHz to several GHz, suitable for mobile information terminals, electronic appliances, etc., and its production method.

SUMMARY OF THE INVENTION

As a result of intensive research in view of the above object, the inventor has noticed that though flaky fine graphene particles are better in electromagnetic wave absorbability than carbon black and carbon nanotube, flaky fine graphene particles are easily aggregated, and thus found that when a small amount of a diluted uniform dispersion of flaky fine graphene particles is applied plural times, and dried after each application, an electromagnetic-wave-absorbing layer having a necessary thickness can be formed while preventing the aggregation of flaky fine graphene particles. The present invention has been completed based on such finding.

Thus, the electromagnetic-wave-absorbing film of the present invention comprising a plastic film, and an electromagnetic-wave-absorbing layer formed on the plastic film, the electromagnetic-wave-absorbing layer comprising flaky fine graphene particles and a binder resin;

the electromagnetic-wave-absorbing layer having a thickness of 2-15 g/m$^2$ (expressed by the weight of fine graphene particles per 1 m$^2$);

a mass ratio of the binder resin to fine graphene particles in the electromagnetic-wave-absorbing layer being 0.05-1; and the total area ratio of regions free of fine graphene particles (fine-graphene-particles-free regions) in the electromagnetic-wave-absorbing layer being 5% or less.

The fine graphene particles preferably have an average diameter of 5-100 μm and an average thickness of 5-50 nm.

The binder resin is preferably an acrylic resin, a polystyrene resin or polyvinyl alcohol.

The electromagnetic-wave-absorbing layer is preferably laminated with a protective film.

The method of the present invention for producing the above electromagnetic-wave-absorbing film comprises repeating plural times a cycle of applying a dispersion comprising 1-10% by mass of fine graphene particles and 0.05-5% by mass of a binder resin in an organic solvent to a plastic film, and then drying the dispersion.

A mass ratio of the binder resin to the fine graphene particles in the dispersion is preferably 0.05-1.

The amount of the dispersion applied at a time is preferably 1-3.5 g/m$^2$ (expressed by the weight of fine graphene particles per 1 m$^2$).

The organic solvent is preferably at least one selected from the group consisting of ketones, aromatic hydrocarbons and alcohols.

The drying is preferably conducted by heating at 30-100° C.

The cycle of applying and drying the dispersion is preferably repeated 2-6 times.

DESCRIPTION OF THE PREFERRED EMBODIMENTS

The embodiments of the present invention will be explained in detail below referring to the attached drawings. Explanations of each embodiment are applicable to other embodiments, unless otherwise mentioned. The following explanations are not restrictive, and various modifications may be made within the scope of the present invention.

[1] Electromagnetic-Wave-Absorbing Film

Figure 1:
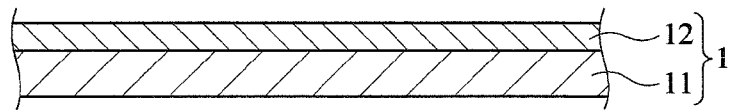
FIG. 1 is a cross-sectional view showing the electromagnetic-wave-absorbing film of the present invention.

As shown in FIG. 1, the electromagnetic-wave-absorbing film of the present invention 1 comprises a plastic film 11, and an electromagnetic-wave-absorbing layer 12 formed on a surface of the plastic film 11.

(1) Plastic Film

Resins forming the plastic film 11 are not particularly restrictive as long as they have sufficient strength, flexibility and workability in addition to insulation, and they may be, for instance, polyesters (polyethylene terephthalate, etc.), polyarylene sulfide (polyphenylene sulfide, etc.), polyether sulfone, polyetheretherketone, polycarbonates, acrylic resins, polyamides, polyimides, polystyrenes, polyolefins (polyethylene, polypropylene, etc.), etc. The thickness of the plastic film 11 may be about 10-50 μm.

(2) Electromagnetic-Wave-Absorbing Layer

The electromagnetic-wave-absorbing layer 12 is formed by fine graphene particles bonded by a binder resin.

(a) Fine Graphene Particles

Figure 2:
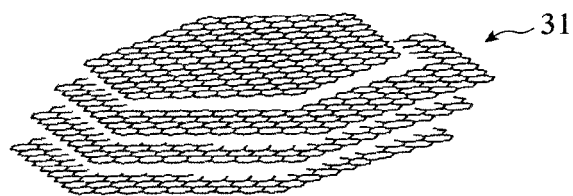
FIG. 2 is a schematic perspective view showing each fine graphene particle used in the present invention.

As shown in FIG. 2, each flaky fine graphene particle 31 has a plate-like structure composed of two-dimensionally bonded benzene rings. Though it may be either monolayer or multi-layer, the multi-layer structure is more preferable from the aspect of conductivity. Because fine graphene particles 31 have a hexagonal lattice structure, each carbon atom is bonded to 3 carbon atoms, one of 4 peripheral electrons used for chemical bonding is in a free state (called "free electron"). Because free electrons are movable along the crystal lattice, fine graphene particles 31 have high conductivity.

Figure 3:
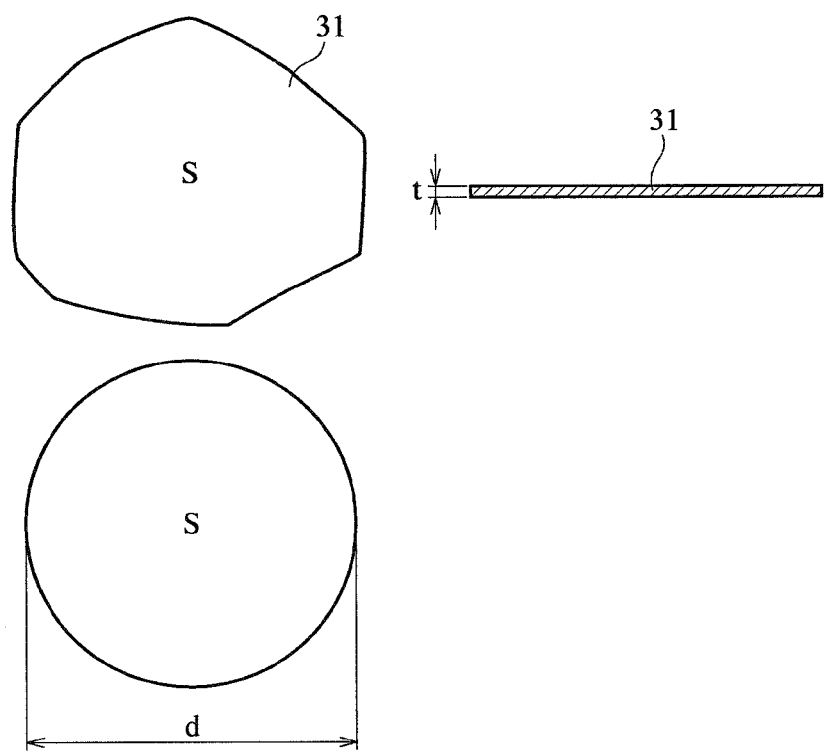
FIG. 3 is a schematic view showing a method for determining a particle size of each fine graphene particle.

Because a fine graphene particle 31 is in a flaky shape, the diameter of the fine graphene particle 31 is expressed by a diameter of its planar surface. Because each fine graphene particle 31 has a planar surface having an irregular contour as shown in FIG. 3, the diameter of each fine graphene particle 31 is expressed by a diameter d of a circle having the same area S. Because the size of each fine graphene particle is expressed by its diameter d and thickness t, the average diameter of fine graphene particles used is expressed by $(\Sigma d)/n$, wherein n represents the number of fine graphene particles, and the average thickness is expressed by $(\Sigma t)/n$. The diameter d and thickness t of fine graphene particles are determined by image analysis of a photomicrograph of fine graphene particles.

Fine graphene particles used in the present invention may have an average diameter in a range of 5-100 μm. When the average diameter of fine graphene particles is less than 5 μm, bonded carbon atoms do not have sufficient length, providing the resultant electromagnetic-wave-absorbing layer with too large surface resistance. On the other hand, when the average diameter of fine graphene particles is more than 100 μm, the electromagnetic-wave-absorbing layer has too small surface resistance. The average diameter of fine graphene particles is preferably 5-50 μm, more preferably 10-30 μm. The average thickness of fine graphene particles may be in a range of 5-50 nm. When the average thickness of fine graphene particles is less than 5 nm, the electromagnetic-wave-absorbing layer has large surface resistance by a binder resin existing between fine graphene particles, making it necessary to use a large amount of fine graphene particles for lower surface resistance, with economic disadvantages. On the other hand, when the average thickness of fine graphene particles is more than 50 nm, fine graphene particles are easily broken when uniformly dispersed in a solvent. The average thickness of fine graphene particles is preferably 5-30 nm, more preferably 10-25 nm.

(b) Binder Resin

Binder resins used in the present invention are not particularly restricted, as long as they are soluble in an organic solvent, and can uniformly disperse fine graphene particles. They may be either thermoplastic resins or thermosetting resins (photo-curing resins). Thermoplastic resins usable in the present invention include acrylic resins such as polymethylacrylate and polymethylmethacrylate, polystyrenes, polycarbonates, polyvinyl chloride, ABS resins, etc. Preferable among them are polymethylmethacrylate and polystyrenes. Thermosetting resins usable in the present invention include epoxy resins, phenol resins, unsaturated polyester resins, alkyd resins, polyurethanes, etc. Photo-curing resins usable in the present invention include diacrylates, triacrylates, etc. Thermosetting resins and photo-curing resins are preferably dissolved in an organic solvent in the form of oligomers.

(c) Composition Ratio

With a smaller mass ratio of a binder resin to fine graphene particles, the electromagnetic-wave-absorbing layer exhibits higher electromagnetic wave absorbability. With too small a percentage of the binder resin, however, fine graphene particles are easily detached. Accordingly, to have both good electromagnetic wave absorbability and high adhesion of fine graphene particles, the binder resin/fine graphene particles mass ratio is preferably 1 or less, more preferably 0.5 or less. The lower limit of the binder resin/fine graphene particles mass ratio is preferably 0.05, more preferably 0.1, most preferably 0.3.

(d) Uniform Distribution of Fine Graphene Particles

Without a uniform distribution of fine graphene particles in the electromagnetic-wave-absorbing layer, (a) fine-graphene-particles-poor regions are formed by the aggregation of fine graphene particles, so that the electromagnetic-wave-absorbing film does not have desired surface resistance, failing to exhibit sufficient electromagnetic wave absorbability, and (b) when the electromagnetic-wave-absorbing film is divided for individual electronic appliances or parts, some divided pieces do not exhibit desired electromagnetic wave absorbability because of many fine-graphene-particles-poor regions. The distribution of fine graphene particles in the electromagnetic-wave-absorbing layer can be evaluated by (1) an area ratio of fine-graphene-particles-free regions determined from a photomicrograph of the electromagnetic-wave-absorbing layer, (2) the surface roughness of the electromagnetic-wave-absorbing layer, and (3) the light transmittance of the electromagnetic-wave-absorbing layer.

(1) Elevation Method by Area Ratio

Figure 4:
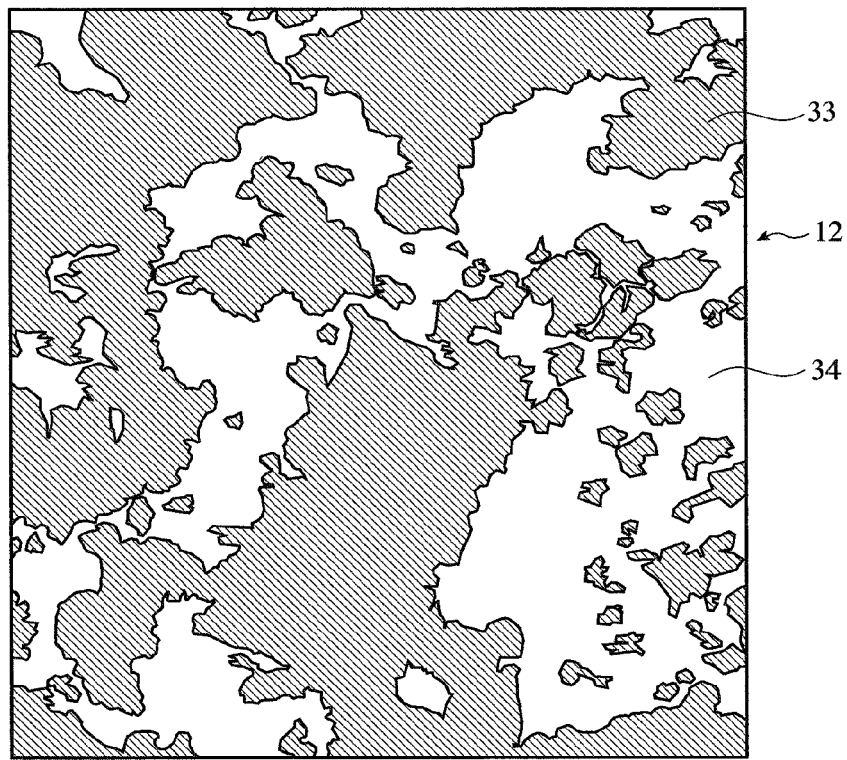
FIG. 4 is a schematic view showing the distribution of fine graphene particles in an electromagnetic-wave-absorbing layer in which fine graphene particles are aggregated.

As shown in FIG. 4, an electromagnetic-wave-absorbing layer 12 suffering the aggregation of fine graphene particles comprises fine-graphene-particles-aggregated regions 33 and fine-graphene-particles-free regions 34. This can be easily confirmed by an electron photomicrograph. With the fine-graphene-particles-aggregated regions 33 having an area $S_1$, and the fine-graphene-particles-free regions having an area $S_2$, the area ratio Rs of the fine-graphene-particles-free regions is determined by $S_2/(S_1+S_2) \times 100(\%)$. By averaging area ratios Rs in electron photomicrographs (magnification: 500 times, size: 10 cm×10 cm) of three arbitrary fields in the electromagnetic-wave-absorbing layer 12, the area ratio of fine-graphene-particles-free regions is determined. When this area ratio is within 5%, it may be that the fine graphene particles are well dispersed. The area ratio of fine-graphene-particles-free regions is preferably within 2%, more preferably 0%.

(2) Evaluation Method by Surface Roughness

Because the electromagnetic-wave-absorbing layer comprises more fine graphene particles than a binder resin, fine-graphene-particles-aggregated regions are thicker than fine-graphene-particles-poor regions. Accordingly, the uniformity of the distribution of fine graphene particles can be determined by measuring the thickness distribution of the electromagnetic-wave-absorbing layer.

Figure 5:
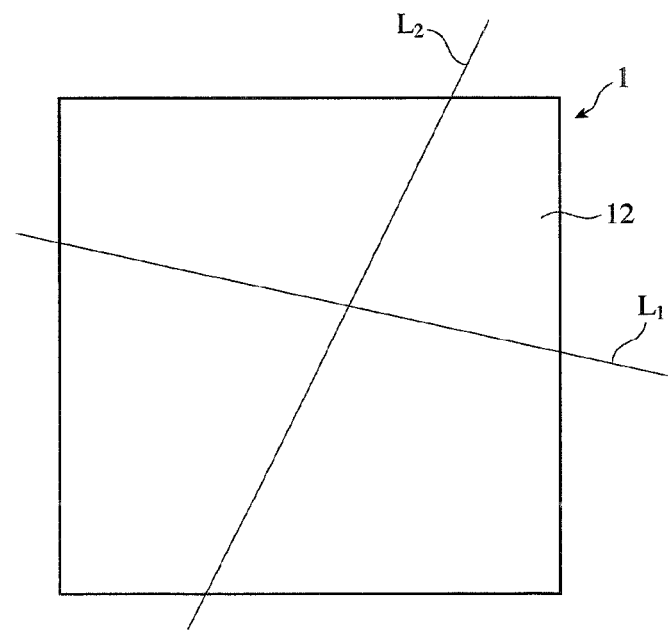
FIG. 5 is a plan view showing a method for measuring the surface roughness of an electromagnetic-wave-absorbing layer of an electromagnetic-wave-absorbing film.
Figure 6A:
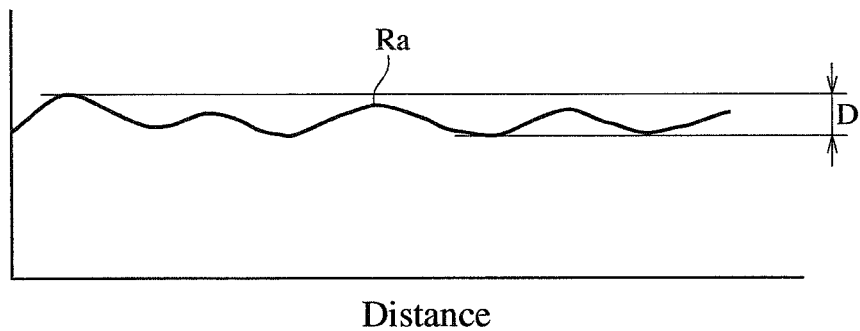
FIG. 6(a) is a graph showing an example of the surface roughness of an electromagnetic-wave-absorbing layer in which fine graphene particles are uniformly dispersed.
Figure 6B:
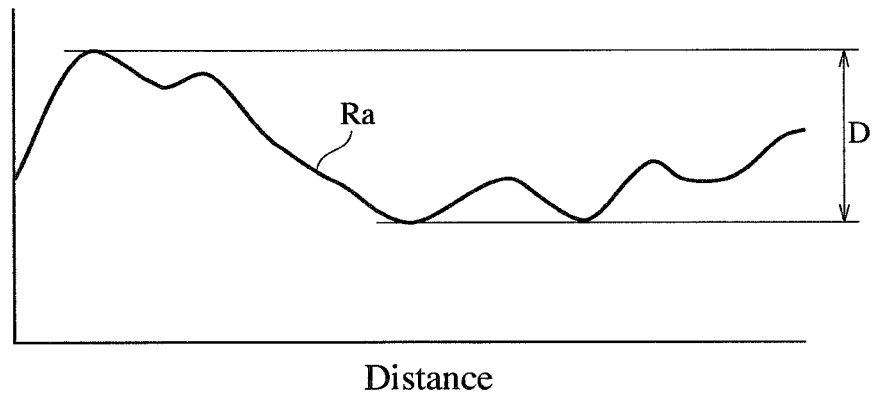
FIG. 6(b) is a graph showing an example of the surface roughness of an electromagnetic-wave-absorbing layer in which fine graphene particles are aggregated.
Figure 7:
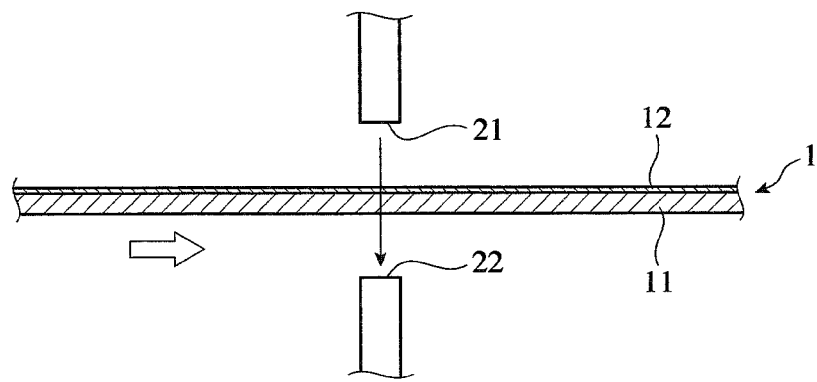
FIG. 7 is a cross-sectional view showing a method for optically measuring the uniformity of fine graphene particles dispersed in an electromagnetic-wave-absorbing layer.

FIG. 5 shows a method of measuring the thickness distribution of electromagnetic-wave-absorbing layer 12. With a test piece of an electromagnetic-wave-absorbing film 1 having a predetermined size placed on a flat table, its surface roughness is measured along arbitrary straight lines $L_1, L_2 \ldots$. FIG. 6(a) shows the surface roughness Ra of an electromagnetic-wave-absorbing layer without aggregated fine graphene particles, and FIG. 6(b) shows the surface roughness Ra of an electromagnetic-wave-absorbing layer with aggregated fine graphene particles. Any surface roughness Ra is subjected to a smoothing treatment.

When the surface roughness Ra is small as shown in FIG. 6(a), it may be that the electromagnetic-wave-absorbing layer 12 has a uniform distribution of fine graphene particles. On the other hand, when the surface roughness Ra is as large as shown in FIG. 6(b), the distribution of fine graphene particles is non-uniform. The uniformity of the distribution of fine graphene particles is expressed by the difference D between the maximum and minimum values of the surface roughness Ra. Therefore, differences $D_1, D_2 \ldots D_n$ are determined along pluralities of (n) arbitrary straight lines $L_1, L_2 \ldots L_n$ in the electromagnetic-wave-absorbing layer 12, and their average Dav $[\Sigma(D_1+D_2+ \ldots +D_n)/n]$ is calculated. Dav may be called "average thickness variation." When the average thickness variation is within 20 μm, the distribution of fine graphene particles is sufficiently uniform. The number n of straight lines measured is 3 or more, preferably 5 or more. The average thickness variation is preferably within 15 μm, more preferably within 10 μm, most preferably within 5 μm. The surface roughness Ra of the electromagnetic-wave-absorbing layer 12 may be measured by a stylus surface roughness meter or a scanning electron microscope (SEM).

(3) Evaluation Method by Light Transmittance

The uniformity of the distribution of fine graphene particles can be determined by the light transmittance of the electromagnetic-wave-absorbing film 1. If fine graphene particles were completely uniformly dispersed, the light transmittance would be 0% as a whole. If some fine graphene particles were aggregated, the light transmittance would be higher as a whole, because light penetrates regions poor in or free of fine graphene particles. Accordingly, the degree of aggregation of fine graphene particles can be elevated by comparing the light transmittance. The light transmittance is measured on pluralities of test pieces arbitrarily cut out of the electromagnetic-wave-absorbing film 1, and the measured values are averaged.

(e) Surface Resistance

To exhibit sufficient electromagnetic wave absorbability, the surface resistance of the electromagnetic-wave-absorbing layer 12 is preferably 50-250 Ω/square, more preferably 100-200 Ω/square. The surface resistance is measured on a square test piece of 10 cm×10 cm cut out of the electromagnetic-wave-absorbing film 1 by a DC two-terminal method. In general, a uniform distribution of fine graphene particles provides the electromagnetic-wave-absorbing layer 12 with smaller surface resistance.

(f) Thickness

The surface resistance of the electromagnetic-wave-absorbing layer 12 depends on the amount of fine graphene particles per a unit area, and the thickness of the electromagnetic-wave-absorbing layer 12 is determined by the amount of fine graphene particles. Thus, the thickness of the electromagnetic-wave-absorbing layer 12 having the above desired surface resistance is expressed by the amount of fine graphene particles per a unit area. The thickness of the electromagnetic-wave-absorbing layer 12 expressed by the amount of fine graphene particles per a unit area is preferably 2-15 $g/m^2$, more preferably 3-12 $g/m^2$, most preferably 4-8 $g/m^2$.

(3) Protective Film

Figure 8A:
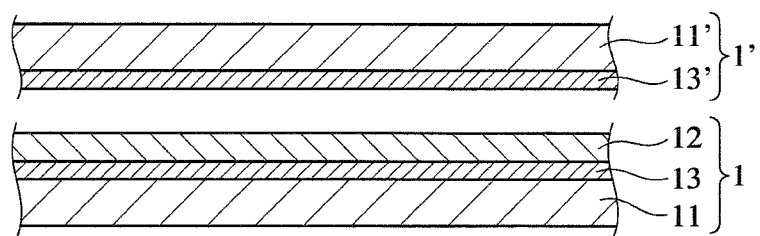
FIG. 8(a) is a cross-sectional view showing a combination of the electromagnetic-wave-absorbing film of the present invention and a protective film.
Figure 8B:
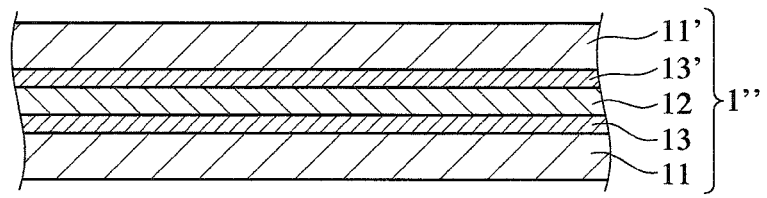
FIG. 8(b) is a cross-sectional view showing an electromagnetic-wave-absorbing film laminate obtained by adhering a protective film to the electromagnetic-wave-absorbing film of the present invention.

To prevent fine graphene particles from detaching, it is preferable to attach a protective film to the electromagnetic-wave-absorbing layer 12. The protective film per se may be made of the same polymer as that of the plastic film constituting the electromagnetic-wave-absorbing film 1. Though the protective film can be bonded by an adhesive, it is preferably heat-fused for the simplification of bonding. In an example shown in FIG. 8(a), the protective film 1' is a heat-fusible layer 13' formed on the plastic film 11'. To have improved adhesion to the protective film 1', the plastic film 11 of the electromagnetic-wave-absorbing film 1 is preferably provided with a heat-fusible layer 13. With the heat-fusible 13' of the protective film 1' heat-fused to the electromagnetic-wave-absorbing layer 12, the protective film 1' is adhered to the electromagnetic-wave-absorbing film 1, resulting in an electromagnetic-wave-absorbing film laminate 1", in which the electromagnetic-wave-absorbing layer 12 is protected. Each heat-fusible layer 13, 13' can be formed by low-melting-point polyethylene, etc. such as an ethylene/α-olefin copolymer.

[2] Production Method of Electromagnetic-Wave-Absorbing Film (1) Preparation of Dispersion of Fine Graphene Particles A dispersion comprising fine graphene particles, a binder resin and an organic solvent is preferably prepared by mixing a dispersion of fine graphene particles in an organic solvent with a solution of a binder resin in an organic solvent. Because fine graphene particles are easily aggregated, fine graphene particles are likely aggregated when fine graphene particles and a binder resin are simultaneously added to an organic solvent. In a dispersion of fine graphene particles obtained by mixing both solutions, the concentration of fine graphene particles is preferably 1-10% by mass, more preferably 1-8% by mass, most preferably 2-8% by mass, particularly 2-7% by mass. The mass ratio of a binder resin to fine graphene particles is preferably 0.05-1, more preferably 0.05-0.5, most preferably 0.1-0.5.

Preferable as the organic solvent used in the dispersion is an organic solvent well dispersing fine graphene particles, dissolving a binder resin, and easy to evaporate to shorten the drying time. Examples of such organic solvent include ketones such as methyl ethyl ketone, aliphatic hydrocarbons such as hexane, aromatic hydrocarbons such as xylene, alcohols such as isopropyl alcohol, etc. Among them, methyl ethyl ketone, xylene, etc. are preferable. They may be used alone or in combination.

(2) Application of Dispersion

Figure 9:
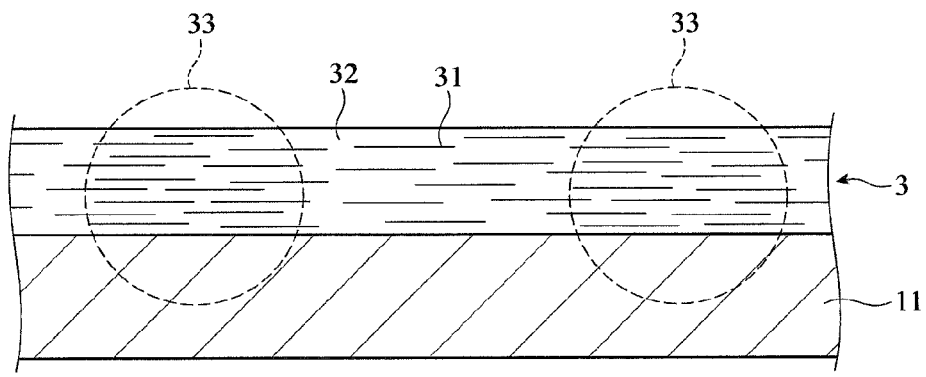
FIG. 9 is a cross-sectional view showing the aggregation of fine graphene particles when a dispersion of fine graphene particles is applied onto a plastic film to form a thick layer at a time.

It has been found that when a dispersion having a desired concentration is applied to a plastic film 11 at a time, fine graphene particles 31 in the dispersion 3 are aggregated in a drying process as schematically shown in FIG. 9. This appears to be due to the fact that though aggregation does not occur in the dispersion 3 having a relatively low concentration of fine graphene particles 31, the percentage of the organic solvent 32 decreases in the drying process, resulting in increase in the concentration of fine graphene particles 32, which leads to aggregation. In FIG. 9, 33 indicates regions 32, in which fine graphene particles are aggregated.

Figure 10:
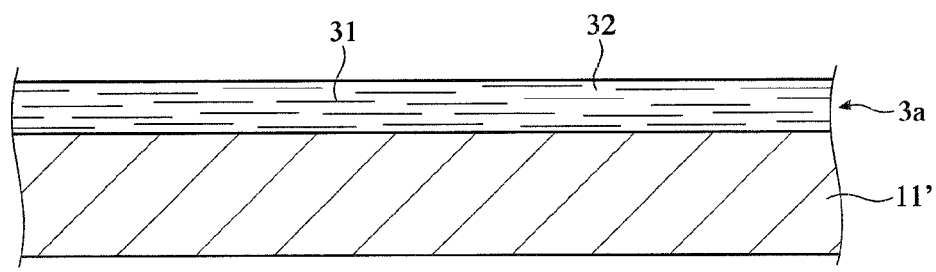
FIG. 10 is a cross-sectional view schematically showing the uniform dispersion of fine graphene particles when a dispersion of fine graphene particles is applied onto a plastic film to form a thin layer at a time.
Figure 11:
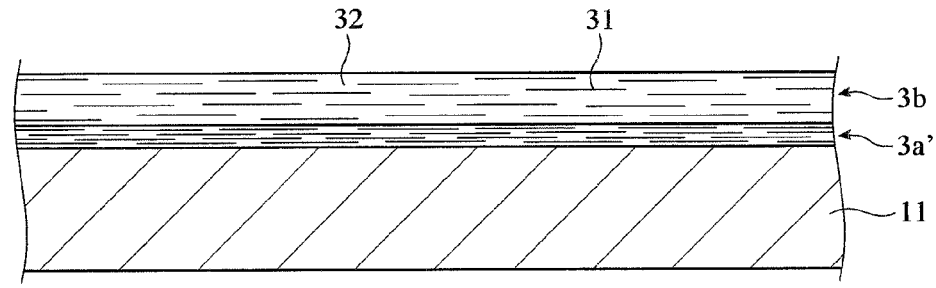
FIG. 11 is a cross-sectional view showing a thin dispersion layer of fine graphene particles applied onto a dried dispersion layer on a plastic film.

Intensive research has revealed that when the dispersion is divided to as small portions as possible to apply a small amount of the dispersion plural times, the aggregation of fine graphene particles 31 can be prevented. In the first application shown in FIG. 10, fine graphene particles 31 remain dispersed substantially horizontally without aggregation when a dispersion layer 3a is dried, because of a small amount of the dispersion layer 3a with sufficiently small thickness relative to the average diameter of fine graphene particles 31. Accordingly, in a layer 3a' of a binder resin and fine graphene particles, which is obtained by drying the dispersion layer 3a, fine graphene particles 31 bonded with a small amount of the binder resin are distributed substantially uniformly and horizontally. When the second application of the dispersion is conducted on a dried layer 3a' of the binder resin and fine graphene particles, as schematically shown in FIG. 11, a dispersion layer 3b comprising fine graphene particles 31 distributed substantially uniformly and horizontally is formed substantially without dissolving the layer 3a' of the binder resin and fine graphene particles. Thus, with a small amount of the dispersion applied plural times, an electromagnetic-wave-absorbing layer 12 free from thickness unevenness, in which fine graphene particles are substantially uniformly distributed, is obtained.

The amount of a dispersion applied at a time is preferably 1-3.5 $g/m^2$, more preferably 1-2.5 $g/m^2$, most preferably 1-2 $g/m^2$, when expressed by the weight of fine graphene particles per a unit area. Less than 1 $g/m^2$ of the dispersion applied at a time makes the uniform dispersion of fine graphene particles rather difficult, and more than 3.5 $g/m^2$ of the dispersion likely causes the aggregation of fine graphene particles. To apply such a small amount of the dispersion uniformly, a spraying method is preferable.

After the applied dispersion is dried, the next application is conducted. Though the dispersion may be spontaneously dried, it may be heated to such an extent not to deform the plastic film to shorten the application step. The heating temperature is determined depending on the boiling point of an organic solvent used. For example, when methyl ethyl ketone is used, the heating temperature is preferably 30-100° C., more preferably 50-80° C. Drying until an organic solvent is completely evaporated from the applied dispersion is not needed, but drying may be conducted to such an extent to prevent fine graphene particles from moving by the next application.

The number of cycles each comprising the application and drying of the dispersion may be generally about 3-6, though variable depending on the thickness of an electromagnetic-wave-absorbing layer 12 to be formed. In the electromagnetic-wave-absorbing layer 12 obtained by repeating the application and drying of the dispersion, the distribution of fine graphene particles 31 is sufficiently uniform.

Figure 12:
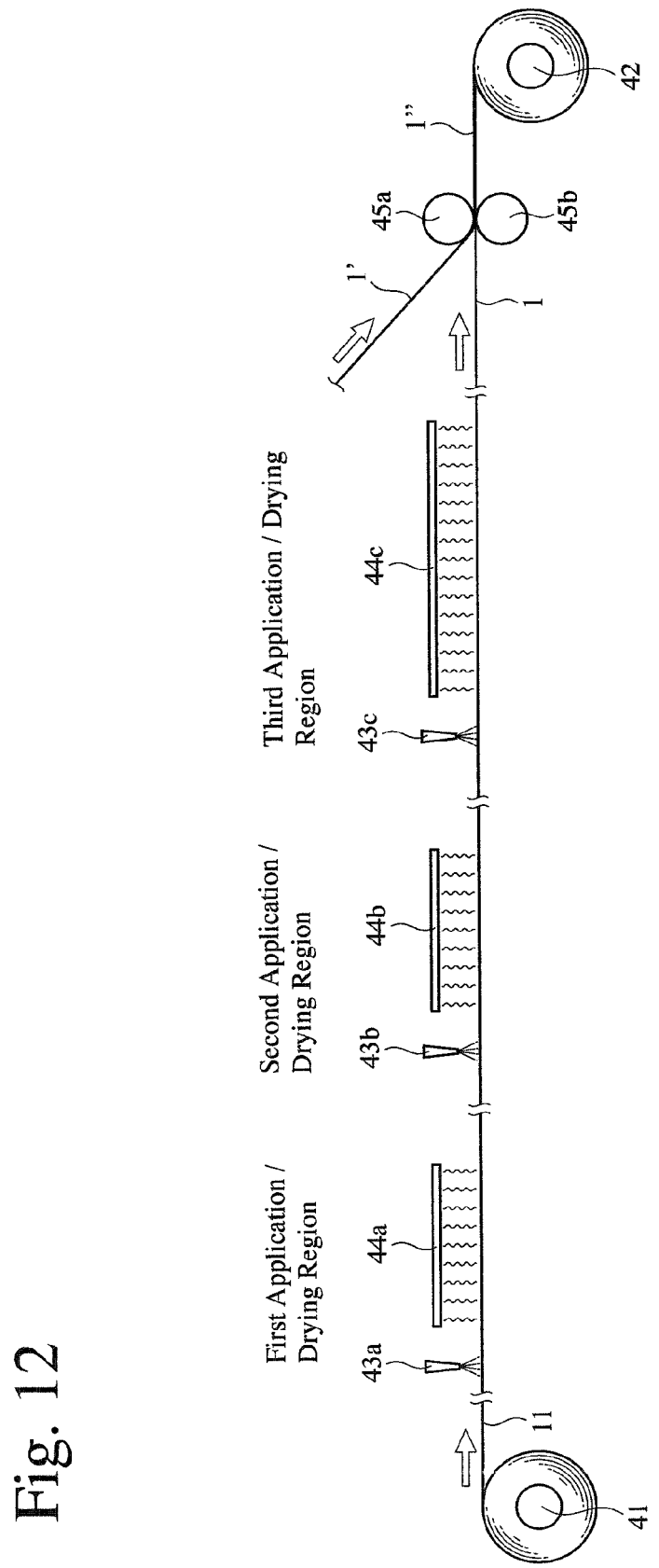
FIG. 12 is a cross-sectional view schematically showing a method of repeating plural times a cycle of applying a dispersion onto a plastic film and drying it.

FIG. 12 schematically shows the application and drying step of a dispersion. In the depicted example, there are three application/drying regions of a dispersion. Each application/drying region comprises a dispersion-applying nozzle 43a, 43b, 43c and a drying heater 44a, 44b, 44c. In place of the drying heater, a hot air blower may be used. Each nozzle 43a, 43b, 43c continuously sprays the dispersion, and each drying heater 44a, 44b, 44c is always heating. The first and second drying heaters 44a, 44b have substantially the same length, and the third drying heater 44c is longer than the first and second drying heaters 44a, 44b.

A plastic film 11 wound off a roll 41 continuously passes through three application/drying regions. In the first application/drying region, a dispersion sprayed from a nozzle 43a is dried by a heater 44a to form a first layer of a binder resin and fine graphene particles. In the second application/drying region, a dispersion sprayed from a nozzle 43b is dried by a heater 44b to form a second layer of a binder resin and fine graphene particles. At this time, of course, the dispersion is applied and dried in the first application/drying region, too.

In the third application/drying region, a dispersion sprayed from a nozzle 43c is dried by a heater 44c to form a third layer of a binder resin and fine graphene particles. At this time, of course, the dispersion is applied and dried in the first and second application/drying regions, too. Because the heater 44c in the third application/drying region is longer than the heaters 44a, 44b in the first and second application/drying regions, the dispersion can be sufficiently dried. Because the dispersion may be dried in the first and second application/drying regions, to such an extent that the distribution of fine graphene particles in the binder resin/fine graphene particles layer is not disturbed by the next application of the dispersion (need not be completely dried), the dispersion should be completely dried in the final drying step.

The plastic film 11 exiting from the third application/drying region is provided with an electromagnetic-wave-absorbing layer 12 constituted by laminated binder resin/fine graphene particles layers. A protective film 1' is adhered to this electromagnetic-wave-absorbing layer 12. The adhesion of the protective film 1' is preferably carried out by heat lamination using a pair of rolls 45a, 45b. An electromagnetic-wave-absorbing film laminate 1" obtained by adhering the protective film 1' is wound around a roll 42.

[3] Absorbability of Near-Field Electromagnetic Wave Noise

Figure 13A:
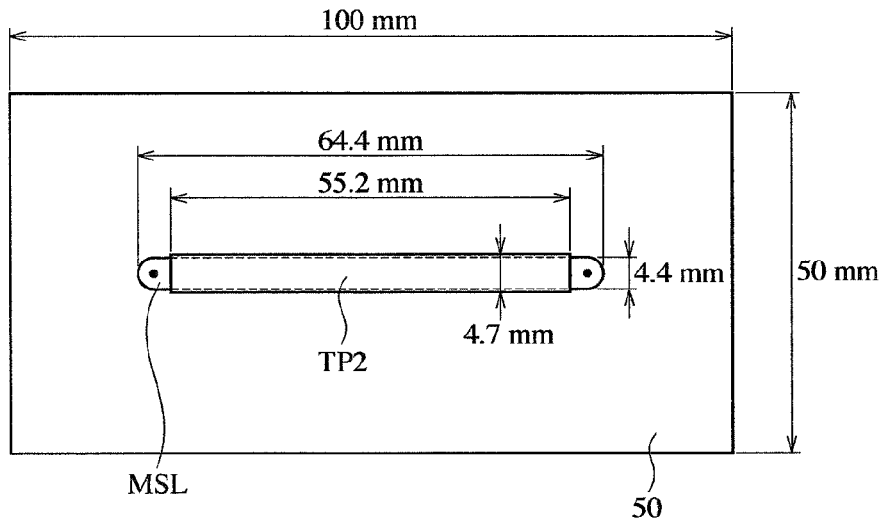
FIG. 13(a) is a plan view showing a system for evaluating the electromagnetic wave absorbability of an electromagnetic-wave-absorbing film.
Figure 13B:
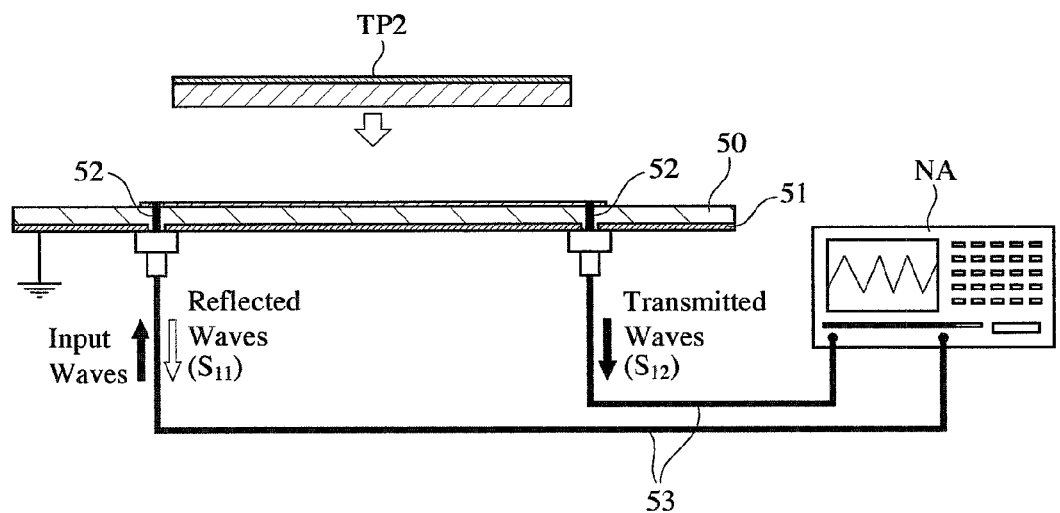
FIG. 13(b) is a partially cross-sectional front view showing the system of FIG. 13(a) for evaluating the electromagnetic wave absorbability.

Using a system comprising a 50-Ω microstripline MSL (64.4 mm×4.4 mm), an insulating substrate 50 supporting the microstripline MSL, a grounded electrode 51 attached to a lower surface of the insulating substrate 50, conductive pins 52, 52 connected to both ends of the microstripline MSL, a network analyzer NA, and coaxial cables 53, 53 connecting the network analyzer NA to the conductive pins 52, 52 as shown in FIGS. 13(a) and 13(b), reflected wave power $S_{11}$ and transmitted wave power $S_{12}$ to input waves of 0.1-6 GHz were measured on a test piece TP2 of the electromagnetic-wave-absorbing film adhered to the microstripline MSL. Power loss $P_{loss}$ is determined by subtracting the reflected wave power $S_{11}$ and the transmitted wave power $S_{12}$ from the input power $P_{in}$, and a noise absorption ratio $P_{loss}/P_{in}$ is determined by dividing $P_{loss}$ by the input power $P_{in}$.

The present invention will be explained in further detail by Examples below, without intention of restricting the present invention thereto.

Example 1

Each dispersion comprising flaky fine graphene particles ("M-25" available from XG Sciences, average diameter: 25 μm, and average thickness: about 6-8 nm) in an amount shown in Table 1, and polymethylmethacrylate (PMMA) in a half amount of the fine graphene particles, the balance being a mixed solvent of xylene and isopropyl alcohol (mass ratio: 60/40), was applied to a polyethylene terephthalate (PET) film 11 as thick as 16 μm, and dried at 50° C. for 5 minutes, to form a fine graphene particles/PMMA layer having a thickness shown in Table 1. This procedure of forming each fine graphene particles/PMMA layer was repeated three times in total to form an electromagnetic-wave-absorbing film 1, which had electromagnetic-wave-absorbing layer 12 composed of fine graphene particles and PMMA having a thickness shown in Table 1. The surface resistance of the electromagnetic-wave-absorbing layer 12 measured by a DC two-terminal method is shown in Table 1.

Light transmittance was measured on three test pieces (10 cm×10 cm) arbitrarily cut out of each electromagnetic-wave-absorbing film 1, and averaged. The average light transmittance is expressed by %, assuming that the light transmittance of the plastic film per se is 100%. The results are shown in Table 1.

TABLE 1

| | Dispersion | | |
|---|---|---|---|
| Sample No. | M-25 (% by mass)[1] | Amount Applied at a Time (g/m²)[2] | Number of Application |
| 11 | 6 | 1.5 | 3 |
| 12 | 6 | 2.0 | 3 |
| 13 | 6 | 2.5 | 3 |
| 14 | 3 | 1.0 | 5 |
| 15 | 2 | 0.7 | 5 |

| | Electromagnetic-Wave-Absorbing Layer | | |
|---|---|---|---|
| Sample No. | Thickness (g/m²)[2] | Surface Resistance (Ω/square) | Average Transmittance[3] (%) |
| 11 | 4.5 | 150 | 1.75 |
| 12 | 6.0 | 95 | 0.49 |
| 13 | 7.5 | 45 | 0.075 |
| 14 | 5.0 | 110 | 1.5 |
| 15 | 3.5 | 200 | 3.5 |

Note:
[1] The concentration of fine graphene particles in the dispersion.
[2] Expressed by grams of fine graphene particles per 1 m².
[3] Average light transmittance (%), with the light transmittance of the plastic film as 100%.

Figure 14:
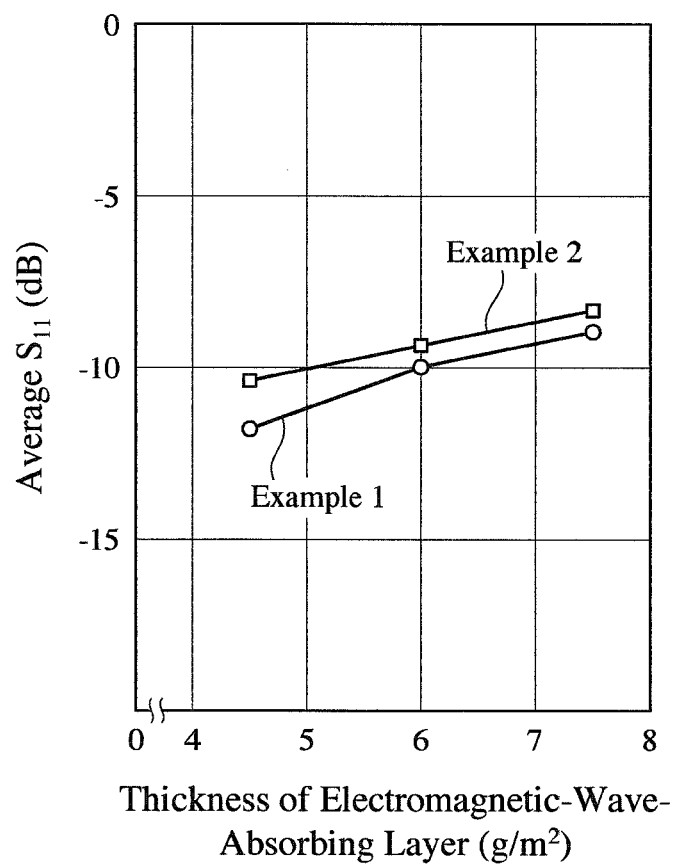
FIG. 14 is a graph showing the relation between the thickness of an electromagnetic-wave-absorbing layer (expressed by the weight of fine graphene particles per 1 $m^2$) and average $S_{11}$ in a range of 1-6 GHz, in the electromagnetic-wave-absorbing films of Examples 1 and 2.

A 16-μm-thick PET film 11' having a 10-μm-thick heat-fusible layer 13' as a protective film 1' was heat-laminated to each electromagnetic-wave-absorbing film 1, with the heat-fusible layer 13' on the side of the electromagnetic-wave-absorbing layer 12, thereby obtaining an electromagnetic-wave-absorbing film laminate 1". With a test piece TP2 (55.2 mm×4.7 mm) cut out of an arbitrary portion of each electromagnetic-wave-absorbing film laminate 1" adhered to a microstripline MSL in the system shown in FIGS. 13(a) and 13(b), its reflected wave power $S_{11}$ in a frequency of 1-6 GHz was measured and averaged. The relation between average $S_{11}$ and the thickness of the electromagnetic-wave-absorbing layer 12 is shown in FIG. 14. As is clear from FIG. 14, the electromagnetic-wave-absorbing film laminate 1" of Example 1 had $S_{11}$ of about −10 dB.

Figure 15:
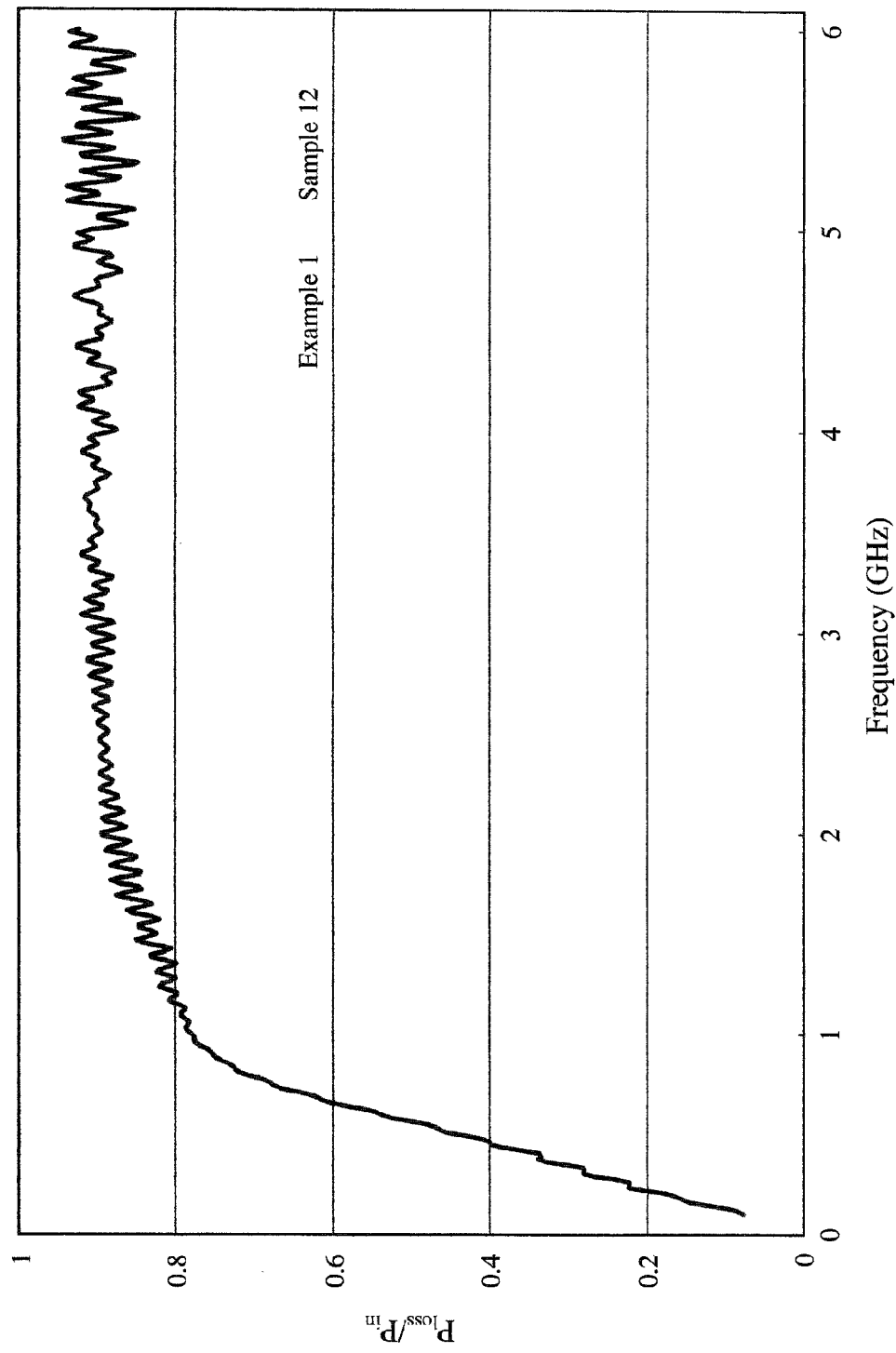
FIG. 15 is a graph showing the $P_{loss}/P_{in}$ of the electromagnetic-wave-absorbing film laminate of Sample 12 in Example 1 (the thickness of an electromagnetic-wave-absorbing layer: 6.0 $g/m^2$) at 0.1-6 GHz.

A test piece TP2 (55.2 mm×4.7 mm) cut out of an arbitrary portion of an electromagnetic-wave-absorbing film laminate 1" obtained by using an electromagnetic-wave-absorbing film 1 (Sample 12) comprising an electromagnetic-wave-absorbing layer 12 having a thickness of 6.0 g/m², among the electromagnetic-wave-absorbing films 1 of Example 1, was adhered to a microstripline MSL in the system shown in FIGS. 13(a) and 13(b), and its reflected wave power $S_{11}$ and transmitted wave power $S_{12}$ were measured in a frequency range of 0.1-6 GHz to determine a noise absorption ratio $P_{loss}/P_{in}$ in a frequency range of 0.1-6 GHz. The $P_{loss}/P_{in}$ is shown in FIG. 15. As is clear from FIG. 15, the electromagnetic-wave-absorbing film laminate 1" of Example 1 had a good noise absorption ratio $P_{loss}/P_{in}$.

Example 2

A test piece TP2 of each electromagnetic-wave-absorbing film laminate 1" of Example 1 was heat-compressed at a temperature of 150° C. and pressure of 200 kg/cm², as the test piece TP2 of Example 2. The reflected wave power $S_{11}$ of the test piece TP2 of Example 2 was measured at a frequency of 1-6 GHz in the same manner as in Example 1, and averaged. The relation between average $S_{11}$ and the thickness of the electromagnetic-wave-absorbing layer 12 is shown in FIG. 14. As is clear from FIG. 14, $S_{11}$ was improved by heat compression.

Example 3

Electromagnetic-wave-absorbing films 1 each having an electromagnetic-wave-absorbing layer 12 composed of fine graphene particles and PMMA, which had a thickness shown in Table 2, were formed in the same manner as in Example 1, except for changing flaky fine graphene particles to "H-5" available from XG Sciences (average diameter: 5 μm, and average thickness: about 15 nm). The surface resistance and average light transmittance of the electromagnetic-wave-absorbing layers 12 measured in the same manner as in Example 1 are shown in Table 2. As is clear from Table 2, fine graphene particles were sufficiently uniformly dispersed regardless of the thickness, in the electromagnetic-wave-absorbing layers 12 of Example 3.

TABLE 2

| | Dispersion | | |
|---|---|---|---|
| Sample No. | H-5 (% by mass)[1] | Amount Applied at a Time (g/m²)[2] | Number of Application |
| 31 | 6 | 1.5 | 3 |
| 32 | 6 | 2.0 | 3 |
| 33 | 6 | 2.5 | 3 |
| 34 | 6 | 3.0 | 3 |
| 35 | 6 | 3.5 | 3 |

| | Electromagnetic-Wave-Absorbing Layer | | |
|---|---|---|---|
| Sample No. | Thickness (g/m²)[2] | Surface Resistance (Ω/square) | Average Transmittance[3] (%) |
| 31 | 4.5 | 155 | 0 |
| 32 | 6.0 | 135 | 0 |
| 33 | 7.5 | 100 | 0 |
| 34 | 9.0 | 40 | 0 |
| 35 | 10.5 | 30 | 0 |

Note:
[1]The concentration of fine graphene particles in the dispersion.
[2]Expressed by grams of fine graphene particles per 1 m².
[3]Average light transmittance (%), with the light transmittance of the plastic film as 100%.

Figure 16:
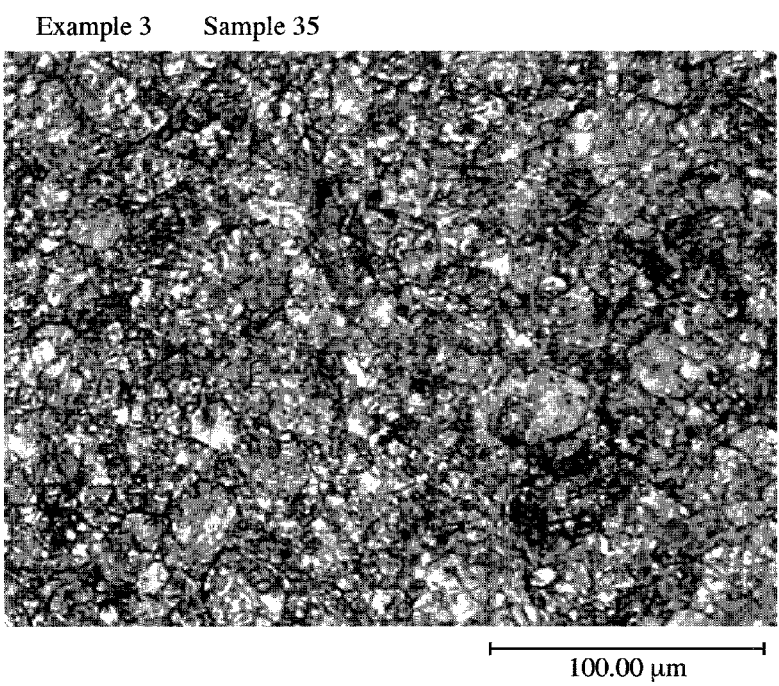
FIG. 16 is a scanning electron photomicrograph showing the electromagnetic-wave-absorbing layer of Sample 35 in Example 3.
Figure 17:
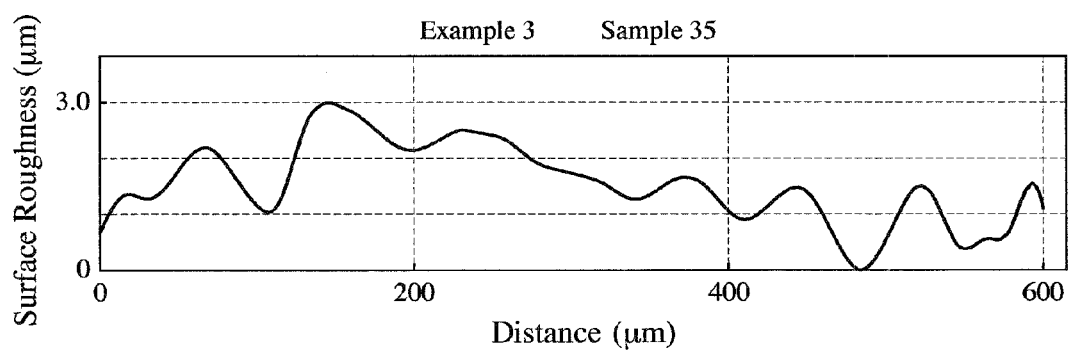
FIG. 17 is a graph showing the surface roughness of the electromagnetic-wave-absorbing layer of Sample 35 in Example 3, which was measured by a scanning electron microscope.

With respect to a test piece arbitrarily cut out of Sample 35, its scanning electron photomicrograph was taken, and its surface roughness was measured by a scanning electron microscope. The scanning electron photomicrograph showing the dispersion of fine graphene particles is shown in FIG. 16, and the surface roughness is shown in FIG. 17. As is clear from FIG. 16, fine graphene particles were uniformly dispersed without fine-graphene-particles-free regions. As is clear from FIG. 17, the electromagnetic-wave-absorbing layer 12 of Sample 35 had extremely small surface roughness, with thickness variation of about 3 μm or less.

Figure 18:
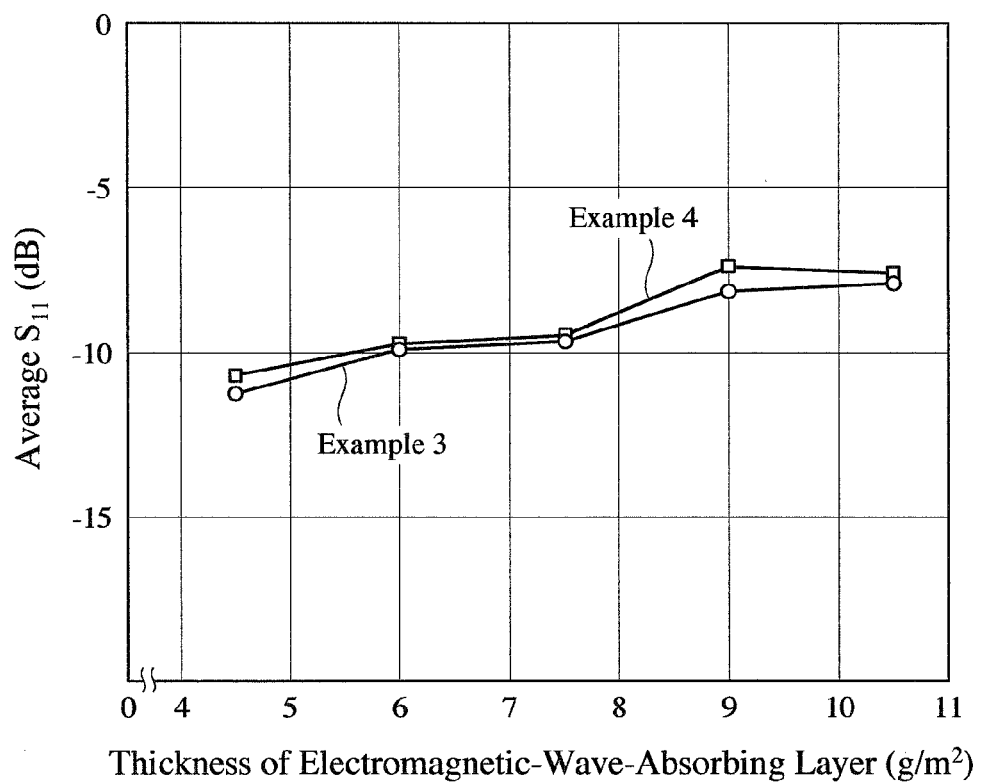
FIG. 18 is a graph showing the relation between the thickness of an electromagnetic-wave-absorbing layer (expressed by the weight of fine graphene particles per 1 $m^2$) and average $S_{11}$ in a range of 1-6 GHz, in the electromagnetic-wave-absorbing films of Examples 3 and 4.

A protective film 1' constituted by a 16-μm-thick PET film 11' having a 10-μm-thick heat-fusible layer 13' was heat-laminated to each electromagnetic-wave-absorbing film 1, with the heat-fusible layer 13' on the side of the electromagnetic-wave-absorbing layer 12, obtaining an electromagnetic-wave-absorbing film laminate 1". A test piece TP2 (55.2 mm×4.7 mm) cut out of an arbitrary portion of each electromagnetic-wave-absorbing film laminate 1" was adhered to a microstripline MSL in the system shown in FIGS. 13(a) and 13(b), and its reflected wave power $S_{11}$ was measured at a frequency of 1-6 GHz, and averaged. The relation between average $S_{11}$ and the thickness of the electromagnetic-wave-absorbing layer 12 is shown in FIG. 18. As is clear from FIG. 18, the electromagnetic-wave-absorbing film laminates 1" of Example 3 had $S_{11}$ substantially smaller than −10 dB.

Figure 19:
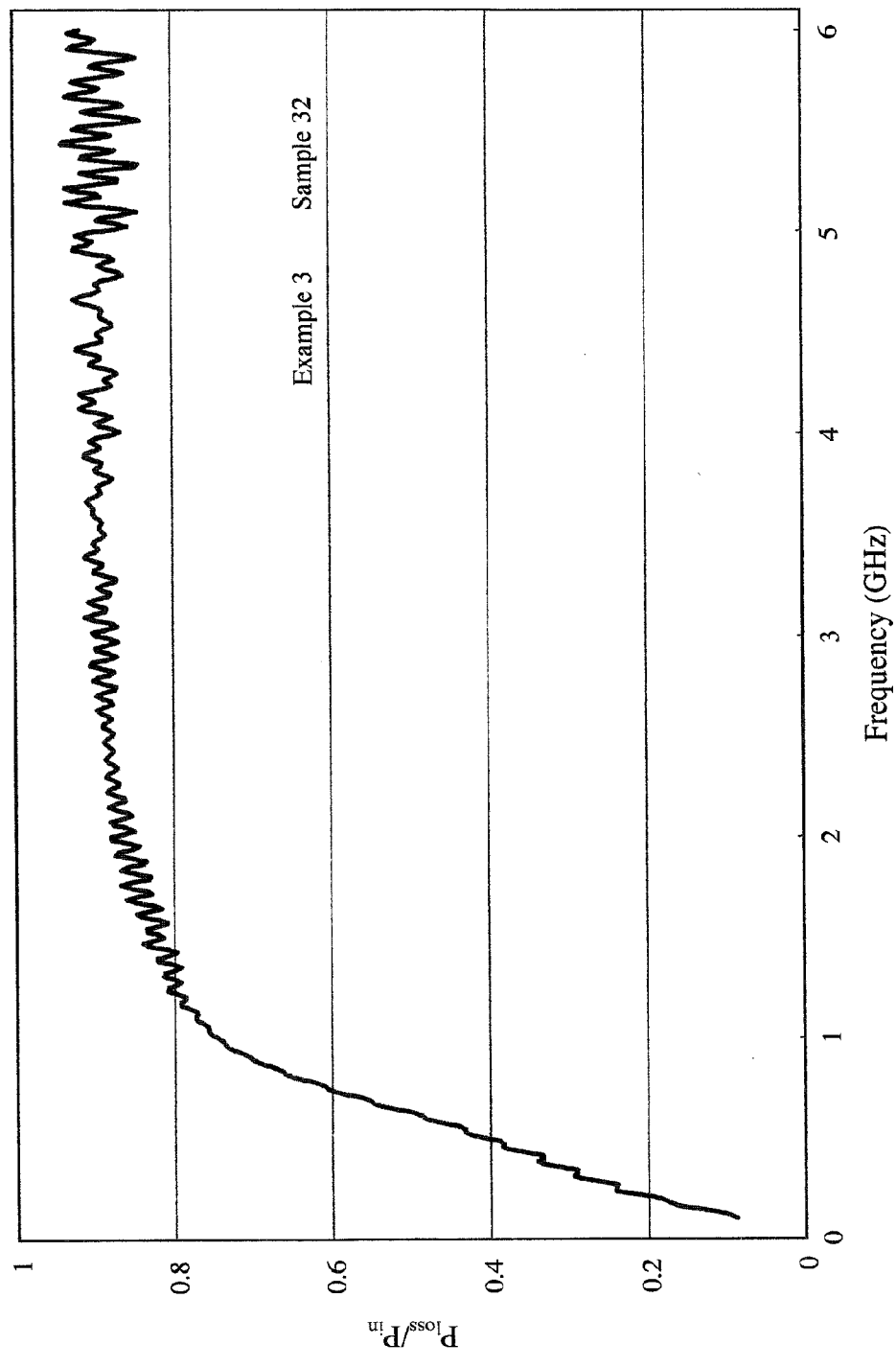
FIG. 19 is a graph showing the $P_{loss}/P_{in}$ of the electromagnetic-wave-absorbing film laminate of Sample 32 in Example 3 (the thickness of the electromagnetic-wave-absorbing layer: 6.0 $g/m^2$) at 0.1-6 GHz.

A test piece TP2 (55.2 mm×4.7 mm) cut out of an arbitrary portion of an electromagnetic-wave-absorbing film laminate 1" obtained by using a electromagnetic-wave-absorbing film 1 (Sample 32) comprising an electromagnetic-wave-absorbing layer 12 having a thickness of 6.0 g/m², among the electromagnetic-wave-absorbing films 1 of Example 3, was adhered to a microstripline MSL in the system shown in FIGS. 13(a) and 13(b), and its reflected wave power $S_{11}$ and transmitted wave power $S_{12}$ were measured in a frequency range of 0.1-6 GHz to determine a noise absorption ratio $P_{loss}/P_{in}$. The $P_{loss}/P_{in}$ is shown in FIG. 19. As is clear from FIG. 19, the electromagnetic-wave-absorbing film laminate 1" of Example 3 had a good noise absorption ratio $P_{loss}/P_{in}$.

Example 4

A test piece TP2 of each sample of Example 3 was heat-compressed at a temperature of 150° C. and pressure of 200 kg/cm², as the test piece TP2 of Example 4. The reflected wave power $S_{11}$ of the test piece TP2 of each sample of Example 4 was measured at a frequency of 1-6 GHz in the same manner as in Example 1, and averaged. The relation between average $S_{11}$ and the thickness of the electromagnetic-wave-absorbing layer 12 is shown in FIG. 18. As is clear from FIG. 18, $S_{11}$ was improved by heat compression.

Example 5

Electromagnetic-wave-absorbing layers 12 composed of fine graphene particles and PMMA, which had a thickness shown in Table 3, was formed in the same manner as in Example 1, except for using a dispersion comprising flaky fine graphene particles ("H-25" available from XG Sciences, average diameter: 25 μm, and average thickness: about 15 nm) in an amount shown in Table 3, and 3% by mass of PMMA, the balance being a mixed solvent of xylene and isopropyl alcohol (mass ratio: 60/40), thereby obtaining an electromagnetic-wave-absorbing film 1 of Example 5. With respect to each sample of Example 5, the surface resistance and average light transmittance of the electromagnetic-wave-absorbing layers 12 measured in the same manner as in Example 1 are shown in Table 3. As is clear from Table 3, fine graphene particles were sufficiently uniformly dispersed regardless of the thickness, in the electromagnetic-wave-absorbing layers 12 of Example 5.

TABLE 3

| | Dispersion | | |
|---|---|---|---|
| Sample No. | H-25 (% by mass)[1] | Amount Applied at a Time (g/m²)[2] | Number of Application |
| 51 | 6 | 1.0 | 3 |
| 52 | 6 | 1.5 | 3 |
| 53 | 6 | 2.0 | 3 |
| 54 | 6 | 2.5 | 3 |

| | Electromagnetic-Wave-Absorbing Layer | | |
|---|---|---|---|
| Sample No. | Thickness (g/m²)[2] | Surface Resistance (Ω/square) | Average Transmittance[3] (%) |
| 51 | 3.0 | 190 | 7.0 |
| 52 | 4.5 | 130 | 3.6 |
| 53 | 6.0 | 50 | 0.7 |
| 54 | 7.5 | 35 | 0.5 |

Note:
[1]The concentration of fine graphene particles in the dispersion.
[2]Expressed by grams of fine graphene particles per 1 m².
[3]Average light transmittance (%), with the light transmittance of the plastic film as 100%.

Figure 20:
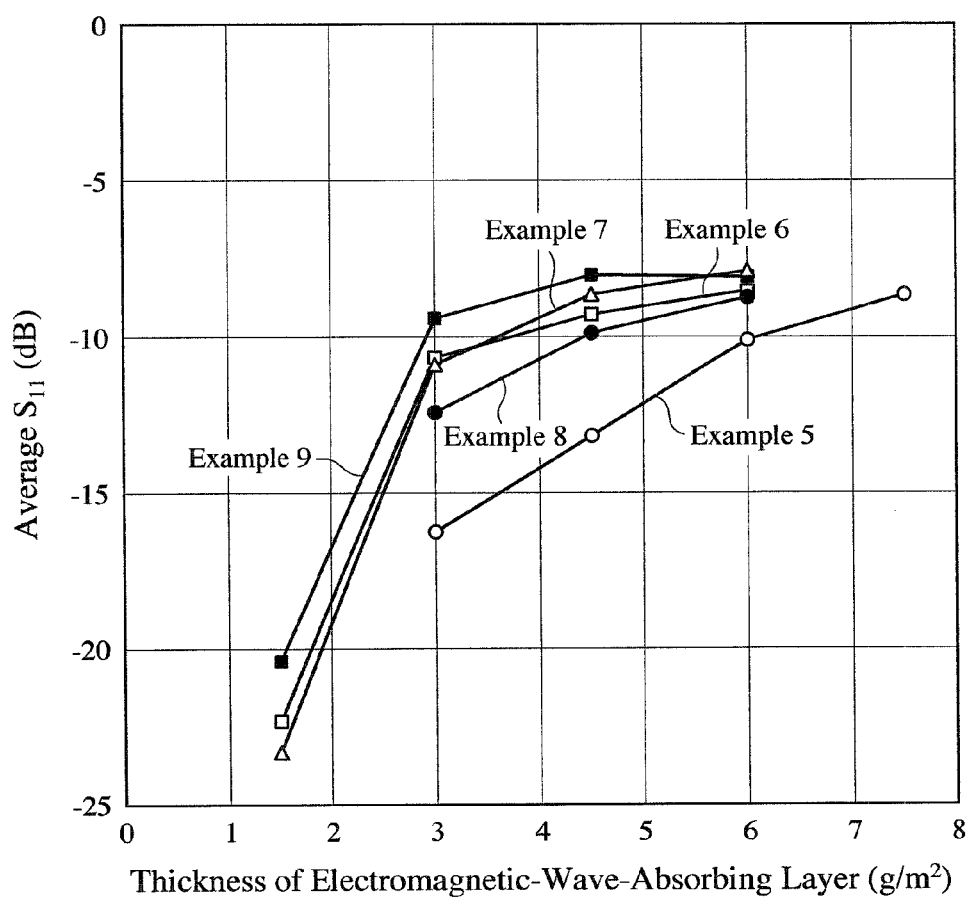
FIG. 20 is a graph showing the relation between the thickness of an electromagnetic-wave-absorbing layer (expressed by the weight of fine graphene particles per 1 $m^2$) and average $S_{11}$ in a range of 1-6 GHz, in the electromagnetic-wave-absorbing films of Examples 5-9.

The same protective film 1' as in Example 1 was heat-laminated to the electromagnetic-wave-absorbing layer 12 of each electromagnetic-wave-absorbing film 1 of Example 5, to obtain an electromagnetic-wave-absorbing film laminate 1" of Example 5. The reflected wave power $S_{11}$ of each electromagnetic-wave-absorbing film laminate 1" was measured at a frequency of 1-6 GHz in the same manner as in Example 1, and averaged. The relation between average $S_{11}$ and the thickness of the electromagnetic-wave-absorbing layer 12 is shown in FIG. 20.

Example 6

An electromagnetic-wave-absorbing layer 12 composed of fine graphene particles and PMMA, which had a thickness shown in Table 4, was formed in the same manner as in Example 1, except for using a dispersion comprising flaky fine graphene particles ("H-25" available from XG Sciences, average diameter: 25 μm, and average thickness: about 15 nm) in an amount shown in Table 4, and 1.8% by mass of PMMA, the balance being a mixed solvent of xylene and isopropyl alcohol (mass ratio: 60/40), thereby obtaining an of electromagnetic-wave-absorbing film 1 of Example 6. With respect to each sample of Example 6, the surface resistance and average light transmittance of the electromagnetic-wave-absorbing layers 12 measured in the same manner as in Example 1 are shown in Table 4. As is clear from Table 4, fine graphene particles were sufficiently uniformly dispersed regardless of the thickness, in the electromagnetic-wave-absorbing layers 12 of Example 6.

TABLE 4

| | Dispersion | | |
|---|---|---|---|
| Sample No. | H-25 (% by mass)[1] | Amount Applied at a Time (g/m²)[2] | Number of Application |
| 61 | 6 | 0.5 | 3 |
| 62 | 6 | 1.0 | 3 |
| 63 | 6 | 1.5 | 3 |
| 64 | 6 | 2.0 | 3 |

| | Electromagnetic-Wave-Absorbing Layer | | |
|---|---|---|---|
| Sample No. | Thickness (g/m²)[2] | Surface Resistance (Ω/square) | Average Transmittance[3] (%) |
| 61 | 1.5 | 6700 | 18 |
| 62 | 3.0 | 70 | 2.3 |
| 63 | 4.5 | 45 | 1 |
| 64 | 6.0 | 30 | 0.2 |

Note:
[1]The concentration of fine graphene particles in the dispersion.
[2]Expressed by grams of fine graphene particlesper 1 m².
[3]Average light transmittance (%), with the light transmittance of the plastic film as 100%.

The same protective film 1' as in Example 1 was heat-laminated to the electromagnetic-wave-absorbing layer 12 of each electromagnetic-wave-absorbing film 1 of Example 6, to obtain an electromagnetic-wave-absorbing film laminate 1" of Example 6. The reflected wave power $S_{11}$ of each electromagnetic-wave-absorbing film laminate 1" was measured at a frequency of 1-6 GHz in the same manner as in Example 1, and averaged. The relation between average $S_{11}$ and the thickness of the electromagnetic-wave-absorbing layer 12 is shown in FIG. 20.

Example 7

A test piece TP2 of each sample of Example 6 was heat-compressed at a temperature of 150° C. and pressure of 200 kg/cm², as the test piece TP2 of Example 7. The reflected wave power $S_{11}$ of the test piece TP2 of each sample of Example 7 was measured at a frequency of 1-6 GHz in the same manner as in Example 1, and averaged. The relation between average $S_{11}$ and the thickness of the electromagnetic-wave-absorbing layer 12 is shown in FIG. 20. As is clear from FIG. 20, $S_{11}$ was improved by heat compression.

Example 8

An electromagnetic-wave-absorbing layer 12 composed of fine graphene particles and PMMA, which had a thickness shown in Table 5, was formed in the same manner as in Example 1, except for using a dispersion comprising flaky fine graphene particles ("H-25" available from XG Sciences, average diameter: 25 μm, and average thickness: about 15 nm) in an amount shown in Table 5, and 1.2% by mass of PMMA, the balance being methyl ethyl ketone, thereby obtaining an electromagnetic-wave-absorbing film 1 of Example 8. With respect to each sample of Example 8, the surface resistance and average light transmittance of the electromagnetic-wave-absorbing layers 12 measured in the same manner as in Example 1 are shown in Table 5. As is clear from Table 5, fine graphene particles were sufficiently uniformly dispersed regardless of the thickness, in the electromagnetic-wave-absorbing layer 12 of Example 8.

TABLE 5

| | Dispersion | | |
|---|---|---|---|
| Sample No. | H-25 (% by mass)[1] | Amount Applied at a Time (g/m²)[2] | Number of Application |
| 81 | 6 | 1.0 | 3 |
| 82 | 6 | 1.5 | 3 |
| 83 | 6 | 2.0 | 3 |

| | Electromagnetic-Wave-Absorbing Layer | | |
|---|---|---|---|
| Sample No. | Thickness (g/m²)[2] | Surface Resistance (Ω/square) | Average Transmittance[3] (%) |
| 81 | 3.0 | 300 | 7.5 |
| 82 | 4.5 | 55 | 1.7 |
| 83 | 6.0 | 30 | 0 |

Note:
[1] The concentration of fine graphene particles in the dispersion.
[2] Expressed by grams of fine graphene particles per 1 m².
[3] Average light transmittance (%), with the light transmittance of the plastic film as 100%.

The same protective film 1' as in Example 1 was heat-laminated to the electromagnetic-wave-absorbing layer 12 of each electromagnetic-wave-absorbing film 1 of Example 8, to obtain an electromagnetic-wave-absorbing film laminate 1" of Example 8. The reflected wave power $S_{11}$ of each electromagnetic-wave-absorbing film laminate 1" was measured at a frequency of 1-6 GHz in the same manner as in Example 1, and averaged. The relation between average $S_{11}$ and the thickness of the electromagnetic-wave-absorbing layer 12 is shown in FIG. 20.

Example 9

An electromagnetic-wave-absorbing layer 12 composed of fine graphene particles and PMMA, which had a thickness shown in Table 6, was formed in the same manner as in Example 1, except for using a dispersion comprising flaky fine graphene particles ("H-25" available from XG Sciences, average diameter: 25 μm, and average thickness: about 15 nm) in an amount shown in Table 6, and 1.8% by mass of PMMA, the balance being methyl ethyl ketone, thereby obtaining an electromagnetic-wave-absorbing film 1 of Example 9. With respect to each sample of Example 9, the surface resistance and average light transmittance of the electromagnetic-wave-absorbing layers 12 measured in the same manner as in Example 1 are shown in Table 6. As is clear from Table 6, fine graphene particles were sufficiently uniformly dispersed regardless of the thickness, in the electromagnetic-wave-absorbing layer 12 of Example 9.

TABLE 6

| | Dispersion | | |
|---|---|---|---|
| Sample No. | H-25 (% by mass)[1] | Amount Applied at a Time (g/m²)[2] | Number of Application |
| 91 | 6 | 0.5 | 3 |
| 92 | 6 | 1.0 | 3 |
| 93 | 6 | 1.5 | 3 |
| 94 | 6 | 2.0 | 3 |

| | Electromagnetic-Wave-Absorbing Layer | | |
|---|---|---|---|
| Sample No. | Thickness (g/m²)[2] | Surface Resistance (Ω/square) | Average Transmittance[3] (%) |
| 91 | 1.5 | 7700 | 19.5 |
| 92 | 3.0 | 220 | 1.5 |
| 93 | 4.5 | 60 | 0.1 |
| 94 | 6.0 | 40 | 0.1 |

Note:
[1] The concentration of fine graphene particles in the dispersion.
[2] Expressed by grams of fine graphene particles per 1 m².
[3] Average light transmittance (%), with the light transmittance of the plastic film as 100%.

The same protective film 1' as in Example 1 was heat-laminated to the electromagnetic-wave-absorbing layer 12 of each electromagnetic-wave-absorbing film 1 of Example 9, to obtain an electromagnetic-wave-absorbing film laminate 1" of Example 9. The reflected wave power $S_{11}$ of each electromagnetic-wave-absorbing film laminate 1" was measured at a frequency of 1-6 GHz in the same manner as in Example 1, and averaged. The relation between average $S_{11}$ and the thickness of the electromagnetic-wave-absorbing layer 12 is shown in FIG. 20. FIG. 20 indicates that a smaller binder resin content expands a frequency range in which $S_{11}$ is −10 dB or less.

Example 10

An electromagnetic-wave-absorbing layer 12 composed of fine graphene particles and PMMA, which had a thickness shown in Table 7, was formed in the same manner as in Example 1, except for using a dispersion comprising flaky fine graphene particles ("H-25" available from XG Sciences, average diameter: 25 μm, and average thickness: about 15 nm) in an amount shown in Table 7, and 0.6% by mass of PMMA, the balance being methyl ethyl ketone, thereby obtaining an electromagnetic-wave-absorbing film 1 of Example 10. With respect to each sample of Example 10, the surface resistance and average light transmittance of the electromagnetic-wave-absorbing layers 12 measured in the same manner as in Example 1 are shown in Table 7. As is clear from Table 7, fine graphene particles were sufficiently uniformly dispersed regardless of the thickness, in the electromagnetic-wave-absorbing layer 12 of Example 10.

The same protective film 1' as in Example 1 was heat-laminated to the electromagnetic-wave-absorbing layer 12 of each electromagnetic-wave-absorbing film 1 of Example 10, to obtain an electromagnetic-wave-absorbing film laminate 1" of Example 10. The reflected wave power $S_{11}$ of each electromagnetic-wave-absorbing film laminate 1" was measured at a frequency of 1-6 GHz in the same manner as in Example 1, and averaged. The relation between average $S_{11}$ and the thickness of the electromagnetic-wave-absorbing layer 12 is shown in Table 7.

TABLE 7

| Sample No. | Dispersion | | |
|---|---|---|---|
| | H-25 (% by mass)[1] | Amount Applied at a Time (g/m²)[2] | Number of Application |
| 101 | 6 | 1.0 | 3 |
| 102 | 6 | 1.5 | 3 |
| 103 | 6 | 2.0 | 3 |
| 104 | 6 | 2.5 | 3 |

| Sample No. | Electromagnetic-Wave-Absorbing Layer | | | |
|---|---|---|---|---|
| | Thickness (g/m²)[2] | Surface Resistance (Ω/square) | Average Transmittance[3] (%) | Average $S_{11}$[4] (dB) |
| 101 | 3.0 | 190 | 7 | −13.6 |
| 102 | 4.5 | 130 | 3.6 | −12.0 |
| 103 | 6.0 | 50 | 0.7 | −9.9 |
| 104 | 7.5 | 35 | 0.5 | −8.7 |

Note:
[1]The concentration of fine graphene particles in the dispersion.
[2]Expressed by grams of fine graphene particles per 1 m².
[3]Average light transmittance (%), with the light transmittance of the plastic film as 100%.
[4]Average $S_{11}$ at a frequency of 1-6 GHz.

Example 11

An electromagnetic-wave-absorbing layer 12 composed of fine graphene particles and PMMA, which had a thickness shown in Table 8, was formed in the same manner as in Example 1, except for using a dispersion comprising flaky fine graphene particles ("H-25" available from XG Sciences, average diameter: 25 μm, and average thickness: about 15 nm) in an amount shown in Table 8, and 1.8% by mass of polyvinyl alcohol (PVA), the balance being a mixed solvent of xylene and isopropyl alcohol (mass ratio: 60/40), thereby obtaining an electromagnetic-wave-absorbing film 1 of Example 11. With respect to each sample of Example 11, the surface resistance and average light transmittance of the electromagnetic-wave-absorbing layers 12 measured in the same manner as in Example 1 are shown in Table 8. As is clear from Table 8, in the electromagnetic-wave-absorbing layer 12 of Example 11, fine graphene particles were sufficiently uniformly dispersed.

TABLE 8

| Sample No. | Dispersion | | |
|---|---|---|---|
| | H-25 (% by mass)[1] | Amount Applied at a Time (g/m²)[2] | Number of Application |
| 111 | 6 | 1.5 | 3 |
| 112 | 6 | 2.5 | 3 |
| 113 | 6 | 3.5 | 3 |

| Sample No. | Electromagnetic-Wave-Absorbing Layer | | |
|---|---|---|---|
| | Thickness (g/m²)[2] | Surface Resistance (Ω/square) | Average Transmittance[3] (%) |
| 111 | 4.5 | 360 | 0.8 |
| 112 | 7.5 | 170 | 0.2 |
| 113 | 10.5 | 110 | 0 |

Note:
[1]The concentration of fine graphene particles in the dispersion.
[2]Expressed by grams of fine graphene particles per 1 m².
[3]Average light transmittance (%), with the light transmittance of the plastic film as 100%.

Figure 21:
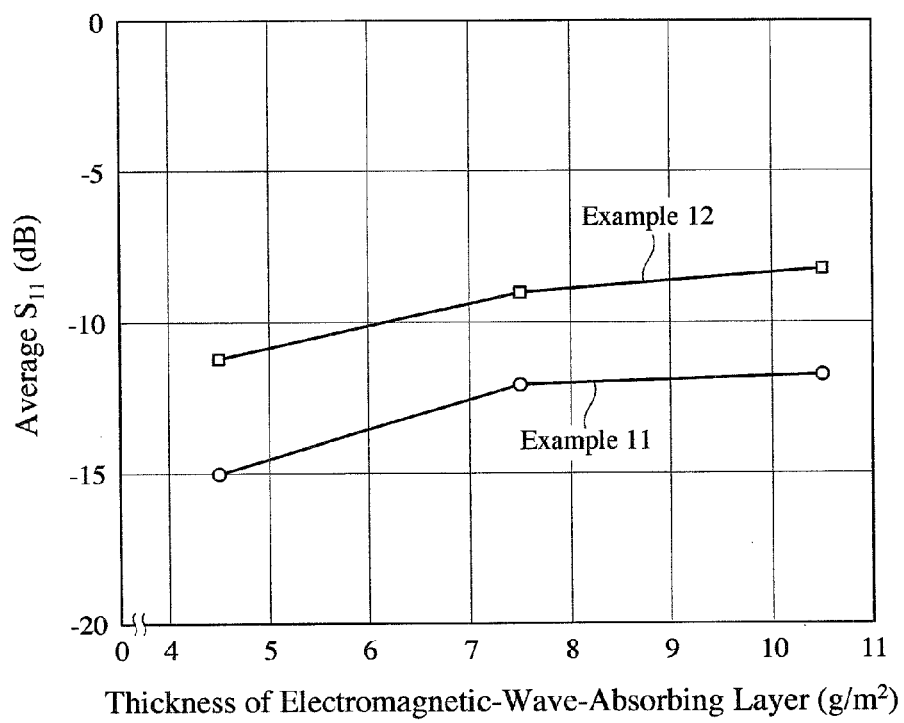
FIG. 21 is a graph showing the relation between the thickness of an electromagnetic-wave-absorbing layer (expressed by the weight of fine graphene particles per 1 $m^2$) and average $S_{11}$ in a range of 1-6 GHz, in the electromagnetic-wave-absorbing films of Examples 11 and 12.

The same protective film 1' as in Example 1 was heat-laminated to the electromagnetic-wave-absorbing layer 12 of each electromagnetic-wave-absorbing film 1 of Example 11, to obtain an electromagnetic-wave-absorbing film laminate 1" of Example 11. The reflected wave power $S_{11}$ of each electromagnetic-wave-absorbing film laminate 1" was measured at a frequency of 1-6 GHz in the same manner as in Example 1, and averaged. The relation between average $S_{11}$ and the thickness of the electromagnetic-wave-absorbing layer 12 is shown in FIG. 21.

Example 12

A test piece TP2 of each sample of Example 11 was heat-compressed at a temperature of 150° C. and pressure of 200 kg/cm², as the test piece TP2 of Example 12. The reflected wave power $S_{11}$ of the test piece TP2 of each sample of Example 12 was measured at a frequency of 1-6 GHz in the same manner as in Example 1, and averaged. The relation between average $S_{11}$ and the thickness of the electromagnetic-wave-absorbing layer 12 is shown in FIG. 21. As is clear from FIG. 21, $S_{11}$ was improved by heat compression.

Example 13

An electromagnetic-wave-absorbing layer 12 composed of fine graphene particles and PMMA, which had a thickness shown in Table 9, was formed in the same manner as in Example 1, except for using a dispersion comprising flaky fine graphene particles ("M-5" available from XG Sciences, average diameter: 5 μm, and average thickness: about 6-8 nm) in an amount shown in Table 9, and 3% by mass of PMMA, the balance being a mixed solvent of xylene and isopropyl alcohol (mass ratio: 60/40), thereby obtaining an electromagnetic-wave-absorbing film 1 of Example 13. With respect to each sample of Example 13, the surface resistance and average light transmittance of the electromagnetic-wave-absorbing layers 12 measured in the same manner as in Example 1 are shown in Table 9. As is clear from Table 9, in the electromagnetic-wave-absorbing layer 12 of Example 13, fine graphene particles were sufficiently uniformly dispersed.

TABLE 9

| Sample No. | Dispersion | | |
|---|---|---|---|
| | M-5 (% by mass)[1] | Amount Applied at a Time (g/m²)[2] | Number of Application |
| 131 | 6 | 2.0 | 3 |
| 132 | 6 | 2.5 | 3 |
| 133 | 6 | 3.0 | 3 |
| 134 | 6 | 3.5 | 3 |
| 135 | 6 | 4.0 | 3 |

| Sample No. | Electromagnetic-Wave-Absorbing Layer | | |
|---|---|---|---|
| | Thickness (g/m²)[2] | Surface Resistance (Ω/square) | Average Transmittance[3] (%) |
| 131 | 6.0 | 170 | 0 |
| 132 | 7.5 | 160 | 0 |
| 133 | 9.0 | 135 | 0 |
| 134 | 10.5 | 105 | 0 |
| 135 | 12.0 | 80 | 0 |

Note:
[1]The concentration of fine graphene particles in the dispersion.
[2]Expressed by grams of fine graphene particles per 1 m².
[3]Average light transmittance (%), with the light transmittance of the plastic film as 100%.

Figure 22:
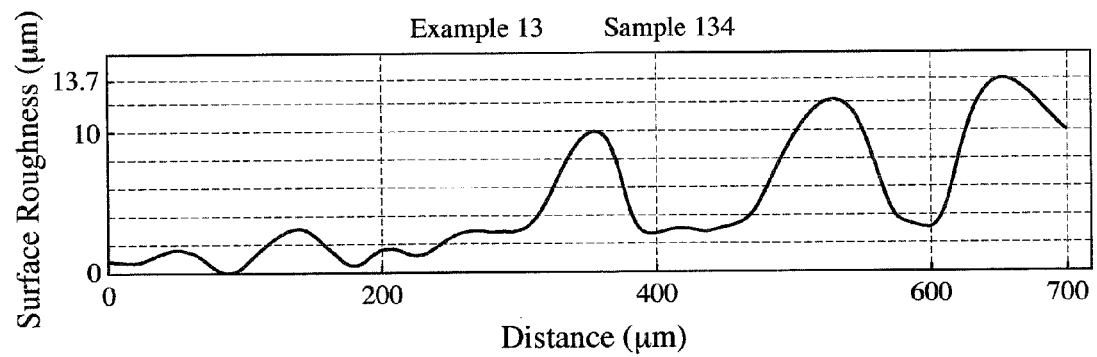
FIG. 22 is a graph showing the surface roughness of the electromagnetic-wave-absorbing layer of Sample 134 in Example 13 measured by a scanning electron microscope.

The surface roughness of a test piece arbitrarily cut out of Sample 134 was measured by a scanning electron microscope. The results are shown in FIG. 22. As is clear from FIG. 22, the electromagnetic-wave-absorbing layer 12 of Sample 134 had small surface roughness, with thickness variation of about 14 μm or less.

Figure 23:
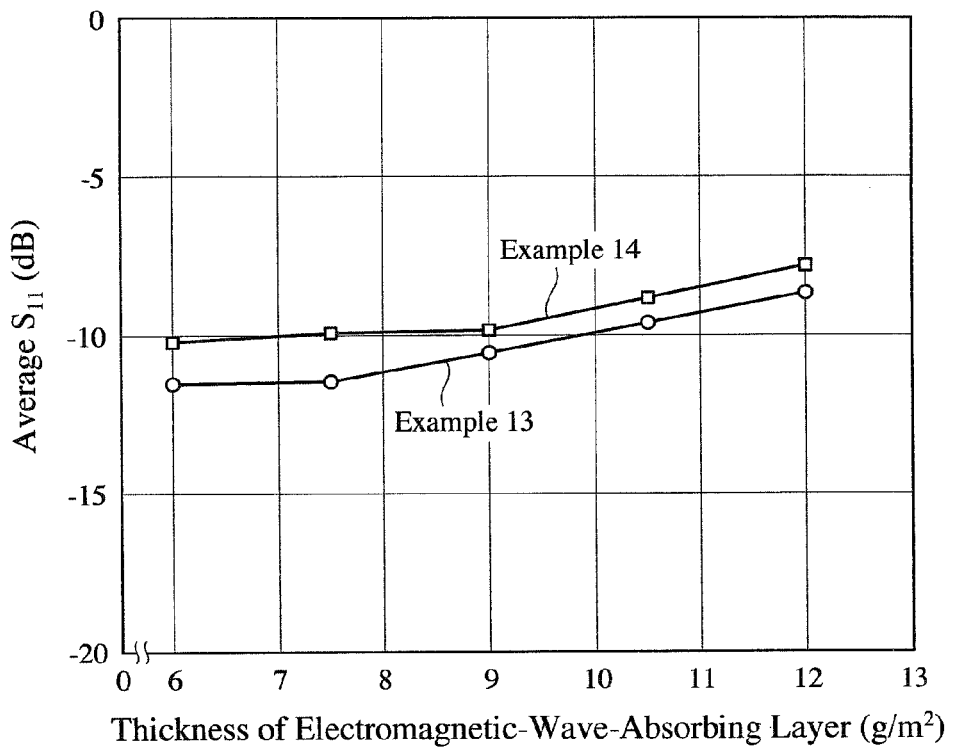
FIG. 23 is a graph showing the relation between the thickness of an electromagnetic-wave-absorbing layer (expressed by the weight of fine graphene particles per 1 $m^2$) and average $S_{11}$ in a range of 1-6 GHz, in the electromagnetic-wave-absorbing films of Examples 13 and 14.

The same protective film 1' as in Example 1 was heat-laminated to the electromagnetic-wave-absorbing layer 12 of each electromagnetic-wave-absorbing film 1 of Example 13, to obtain an electromagnetic-wave-absorbing film laminate 1" of Example 13. The reflected wave power $S_{11}$ of each electromagnetic-wave-absorbing film laminate 1" was measured at a frequency of 1-6 GHz in the same manner as in Example 1, and averaged. The relation between average $S_{11}$ and the thickness of the electromagnetic-wave-absorbing layer 12 is shown in FIG. 23.

Example 14

A test piece TP2 of each sample of Example 14 was heat-compressed at a temperature of 150° C. and pressure of 200 kg/cm², as the test piece TP2 of Example 14. The reflected wave power $S_{11}$ of the test piece TP2 of each sample of Example 14 was measured at a frequency of 1-6 GHz in the same manner as in Example 1, and averaged. The relation between average $S_{11}$ and the thickness of the electromagnetic-wave-absorbing layer 12 is shown in FIG. 23. As is clear from FIG. 23, $S_{11}$ was improved by heat compression.

Example 15

An electromagnetic-wave-absorbing layer 12 composed of fine graphene particles and PMMA, which had a thickness shown in Table 10, was formed in the same manner as in Example 1, except for using a dispersion comprising flaky fine graphene particles ("M-15" available from XG Sciences, average diameter: 15 μm, and average thickness: 6-8 nm) in an amount shown in Table 10, and 1.8% by mass of PMMA, the balance being methyl ethyl ketone, thereby obtaining an electromagnetic-wave-absorbing film 1 of Example 15. With respect to each sample of Example 15, the surface resistance and average light transmittance of the electromagnetic-wave-absorbing layers 12 measured in the same manner as in Example 1 are shown in Table 10. As is clear from Table 10, fine graphene particles were sufficiently uniformly dispersed regardless of the thickness, in the electromagnetic-wave-absorbing layer 12 of Example 15.

The same protective film 1' as in Example 1 was heat-laminated to the electromagnetic-wave-absorbing layer 12 of each electromagnetic-wave-absorbing film 1 of Example 15, to obtain an electromagnetic-wave-absorbing film laminate 1" of Example 15. The reflected wave power $S_{11}$ of each electromagnetic-wave-absorbing film laminate 1" was measured at a frequency of 1-6 GHz in the same manner as in Example 1, and averaged. The relation between average $S_{11}$ and the thickness of the electromagnetic-wave-absorbing layer 12 is shown in Table 10.

TABLE 10

| | Dispersion | | |
| --- | --- | --- | --- |
| Sample No. | M-15 (% by mass)[1] | Amount Applied at a Time (g/m²)[2] | Number of Application |
| 151 | 6 | 1.0 | 3 |
| 152 | 6 | 1.5 | 3 |
| 153 | 6 | 2.0 | 3 |
| 154 | 6 | 2.5 | 3 |

TABLE 10-continued

| | Electromagnetic-Wave-Absorbing Layer | | | |
| --- | --- | --- | --- | --- |
| Sample No. | Thickness (g/m²)[2] | Surface Resistance (Ω/square) | Average Transmittance[3] (%) | Average $S_{11}$[4] (dB) |
| 151 | 3.0 | 190 | 2 | −12.6 |
| 152 | 4.5 | 70 | 0.3 | −11.3 |
| 153 | 6.0 | 50 | 0 | −9.8 |
| 154 | 7.5 | 25 | 0 | −8.0 |

Note:
[1]The concentration of fine graphene particles in the dispersion.
[2]Expressed by grams of fine graphene particles per 1 m².
[3]Average light transmittance (%), with the light transmittance of the plastic film as 100%.
[4]Average $S_{11}$ at a frequency of 1-6 GHz.

Examples 16

An electromagnetic-wave-absorbing layer 12 composed of fine graphene particles and PMMA, which had a thickness shown in Table 11, was formed in the same manner as in Example 1, except for using a dispersion comprising flaky fine graphene particles ("H-15" available from XG Sciences, average diameter: 15 μm, and average thickness: about 15 nm) in an amount shown in Table 11, and 1.8% by mass of PMMA, the balance being methyl ethyl ketone, thereby obtaining an electromagnetic-wave-absorbing film 1 of Example 16. With respect to each sample of Example 16, the surface resistance and average light transmittance of the electromagnetic-wave-absorbing layers 12 measured in the same manner as in Example 1 are shown in Table 11. As is clear from Table 11, fine graphene particles were sufficiently uniformly dispersed regardless of the thickness, in the electromagnetic-wave-absorbing layer 12 of Example 16.

The same protective film 1' as in Example 1 was heat-laminated to the electromagnetic-wave-absorbing layer 12 of each electromagnetic-wave-absorbing film 1 of Example 16, to obtain an electromagnetic-wave-absorbing film laminate 1" of Example 16. The reflected wave power $S_{11}$ of each electromagnetic-wave-absorbing film laminate 1" was measured at a frequency of 1-6 GHz in the same manner as in Example 1, and averaged. The relation between average $S_{11}$ and the thickness of the electromagnetic-wave-absorbing layer 12 is shown in Table 11.

TABLE 11

| | Dispersion | | |
| --- | --- | --- | --- |
| Sample No. | H-15 (% by mass)[1] | Amount Applied at a Time (g/m²)[2] | Number of Application |
| 161 | 6 | 2.0 | 3 |
| 162 | 6 | 2.5 | 3 |
| 163 | 6 | 3.0 | 3 |
| 164 | 6 | 3.5 | 3 |

| | Electromagnetic-Wave-Absorbing Layer | | | |
| --- | --- | --- | --- | --- |
| Sample No. | Thickness (g/m²)[2] | Surface Resistance (Ω/square) | Average Transmittance[3] (%) | Average $S_{11}$[4] (dB) |
| 161 | 6.0 | 280 | 4.8 | −13.1 |
| 162 | 7.5 | 130 | 0.8 | −11.2 |
| 163 | 9.0 | 90 | 0.2 | −10.7 |
| 164 | 10.5 | 60 | 0 | −9.2 |

Note:
[1]The concentration of fine graphene particles in the dispersion.
[2]Expressed by grams of fine graphene particles per 1 m².
[3]Average light transmittance (%), with the light transmittance of the plastic film as 100%.
[4]Average $S_{11}$ at a frequency of 1-6 GHz.

Comparative Example 1

The same dispersion as in Example 3 was applied at a thickness of 10.5 g/m² (expressed by the weight of fine graphene particles per 1 m²) to a plastic film 11 at a time, and dried at 50° C. for 5 minutes to form an electromagnetic-wave-absorbing film 1. The electromagnetic-wave-absorbing layer 12 of this electromagnetic-wave-absorbing film 1 had surface resistance of 3000 Ω/square or more, and as large average light transmittance as 20%. This indicates that when the dispersion is applied to a predetermined thickness at a time, an electromagnetic-wave-absorbing layer 12 with large thickness variation, in which fine graphene particles are aggregated, is formed.

Figure 24:
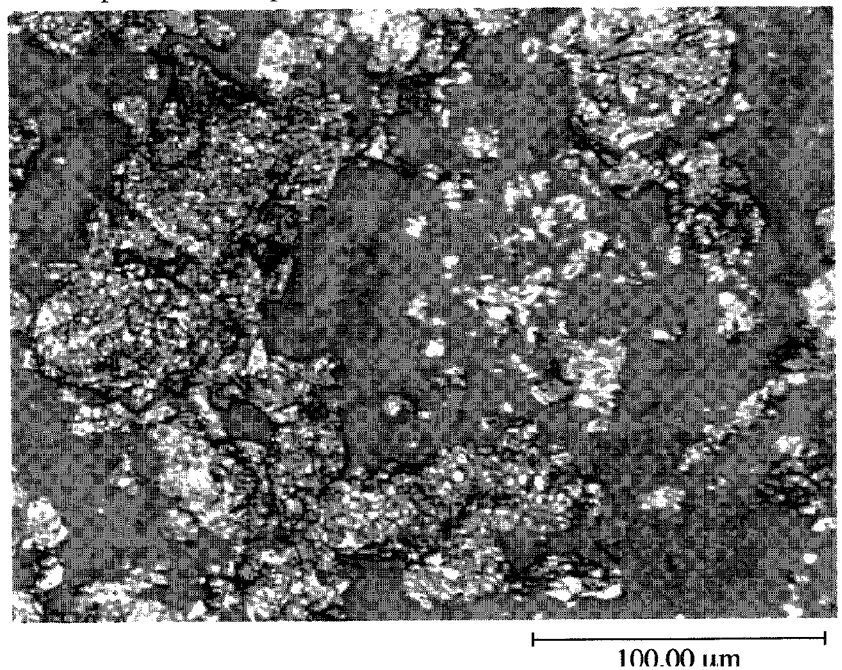
FIG. 24 is a scanning electron photomicrograph showing the electromagnetic-wave-absorbing layer of Comparative Example 1.
Figure 25:
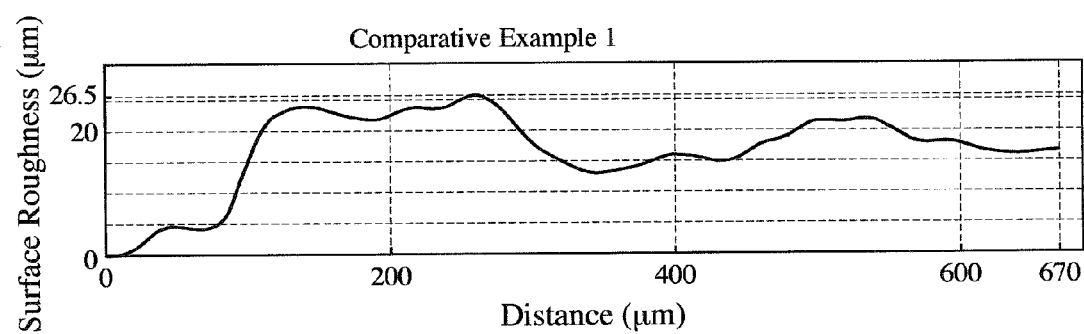
FIG. 25 is a graph showing the surface roughness of the electromagnetic-wave-absorbing layer of Comparative Example 1 measured by a scanning electron microscope.

With respect to a test piece arbitrarily cut out of this electromagnetic-wave-absorbing film 1, its scanning electron photomicrograph was taken, and its surface roughness was measured by a scanning electron microscope. The scanning electron photomicrograph showing the dispersion of fine graphene particles is shown in FIG. 24, and the surface roughness is shown in FIG. 25. As is clear from FIG. 24, fine graphene particles were aggregated, resulting in a lot of fine-graphene-particles-free regions, in the electromagnetic-wave-absorbing layer 12 of Comparative Example 1. As is clear from FIG. 25, the electromagnetic-wave-absorbing layer 12 of Comparative Example 1 had extremely large surface roughness, with thickness variation of about 26 μm.

Comparative Example 2

An electromagnetic-wave-absorbing layer 12 was formed in the same manner as in Example 1 except for changing the concentration of fine graphene particles in the dispersion to 12% by mass. The electromagnetic-wave-absorbing layer 12 had surface resistance of 500 Ω/square or more and as large average light transmittance as 10%. This indicates that when the concentration of fine graphene particles in the dispersion is too high, an electromagnetic-wave-absorbing layer 12 with large thickness variation, in which fine graphene particles are aggregated, is formed, even though the dispersion is divided to conduct application 3 times.

Comparative Example 3

An electromagnetic-wave-absorbing layer 12 was formed in the same manner as in Example 1, except for changing the concentrations of fine graphene particles and PMMA in the dispersion to 3% by mass and 5% by mass, respectively. The electromagnetic-wave-absorbing layer 12 had as large surface resistance as 5000 Ω/square or more. This indicates that too large a mass ratio of PMMA (binder resin) to fine graphene particles in the dispersion provides too large surface resistance.

EFFECT OF THE INVENTION

Because the electromagnetic-wave-absorbing film of the present invention comprises an electromagnetic-wave-absorbing layer containing flaky fine graphene particles uniformly dispersed therein, it exhibits high absorbability to electromagnetic wave noises of several hundreds of MHz to several GHz, without absorbability variation. Accordingly, even if it were cut to desired sizes, excellent electromagnetic wave absorbability can be exhibited without unevenness. The electromagnetic-wave-absorbing films of the present invention having such features are effective for the absorption of near-field electromagnetic wave noises of several hundreds of MHz to several GHz, in various mobile information terminals such as cell phones, smartphones, etc., and electronic appliances such as personal computers, etc.

What is claimed is:

1. A method for producing an electromagnetic-wave-absorbing film comprising a plastic film, and an electromagnetic-wave-absorbing layer formed on said plastic film, said electromagnetic-wave-absorbing layer comprising graphene particles and a binder resin; a mass ratio of said binder resin to said graphene particles in said electromagnetic-wave-absorbing layer being 0.05-0.5; and the total area ratio of regions free of graphene particles in said electromagnetic-wave-absorbing layer being 5% or less, the method comprising:
   repeating plural times a cycle of applying a dispersion comprising 1-10% by mass of said graphene particles and 0.05-5% by mass of said binder resin in an organic solvent to a surface of said plastic film, and then drying said dispersion; the amount of said dispersion applied at a time being 1-3.5 g/m² (expressed by the weight of graphene particles per 1 m²), wherein
   said graphene particles have an average diameter of 5-100 μm and an average thickness of 5-50 nm.

2. The method for producing an electromagnetic-wave-absorbing film according to claim 1, wherein said binder resin is an acrylic resin, a polystyrene resin or polyvinyl alcohol.

3. The method for producing an electromagnetic-wave-absorbing film according to claim 1, wherein said organic solvent is at least one selected from the group consisting of ketones, aromatic hydrocarbons and alcohols.

4. The method for producing an electromagnetic-wave-absorbing film according to claim 1, wherein said drying is conducted by heating at 30-100° C.

5. The method for producing an electromagnetic-wave-absorbing film according to claim 1, wherein the cycle of applying and drying said dispersion is repeated 2-6 times.

* * * * *